(12) United States Patent
Liu et al.

(10) Patent No.: US 7,948,008 B2
(45) Date of Patent: May 24, 2011

(54) FLOATING BODY FIELD-EFFECT TRANSISTORS, AND METHODS OF FORMING FLOATING BODY FIELD-EFFECT TRANSISTORS

(75) Inventors: Jun Liu, Boise, ID (US); Michael P. Violette, Boise, ID (US); Chandra Mouli, Boise, ID (US); Howard Kirsch, Eagle, ID (US); Di Li, Highland, CA (US)

(73) Assignee: Micron Technology, Inc., Boise, ID (US)

( * ) Notice: Subject to any disclaimer, the term of this patent is extended or adjusted under 35 U.S.C. 154(b) by 633 days.

(21) Appl. No.: 11/925,573

(22) Filed: Oct. 26, 2007

(65) Prior Publication Data

US 2009/0108292 A1    Apr. 30, 2009

(51) Int. Cl.
| H01L 31/0328 | (2006.01) |
| H01L 31/0336 | (2006.01) |
| H01L 31/072 | (2006.01) |
| H01L 31/109 | (2006.01) |
| H01L 27/01 | (2006.01) |
| H01L 27/12 | (2006.01) |
| H01L 31/0392 | (2006.01) |

(52) U.S. Cl. ............ 257/190; 257/347; 257/E21.403; 257/E29.246; 257/E29.273

(58) Field of Classification Search ........... 257/E21.403, 257/190, 347, E29.246, E29.273
See application file for complete search history.

(56) References Cited

U.S. PATENT DOCUMENTS

| 5,774,411 | A | 6/1998 | Hsieh et al. |
| 5,834,806 | A | 11/1998 | Lin et al. |
| 6,541,822 | B2 | 4/2003 | Bae et al. |
| 6,573,545 | B2 | 6/2003 | Kim et al. |
| 6,873,539 | B1 | 3/2005 | Fazan et al. |
| 6,925,006 | B2 | 8/2005 | Fazan et al. |
| 6,930,918 | B2 | 8/2005 | Fazan et al. |
| 6,934,186 | B2 | 8/2005 | Fazan et al. |
| 6,937,516 | B2 | 8/2005 | Fazan et al. |
| 6,943,083 | B2 | 9/2005 | Forbes |
| 6,969,662 | B2 | 11/2005 | Fazan et al. |
| 6,982,918 | B2 | 1/2006 | Fazan et al. |
| 7,031,203 | B2 | 4/2006 | Tang et al. |
| 7,034,336 | B2 | 4/2006 | Willer |
| 7,061,050 | B2 | 6/2006 | Fazan et al. |

(Continued)

FOREIGN PATENT DOCUMENTS

| JP | 2004342842 | 12/2004 |
| TW | 262591 B | 9/2006 |

OTHER PUBLICATIONS

WO PCT/US2008/077027, Apr. 15, 2009, Search Report.

(Continued)

*Primary Examiner* — David S Blum
(74) *Attorney, Agent, or Firm* — Wells St. John P.S.

(57) ABSTRACT

In one embodiment, a floating body field-effect transistor includes a pair of source/drain regions having a floating body channel region received therebetween. The source/drain regions and the floating body channel region are received over an insulator. A gate electrode is proximate the floating body channel region. A gate dielectric is received between the gate electrode and the floating body channel region. The floating body channel region has a semiconductor $Si_xGe_{(1-x)}$-comprising region. The floating body channel region has a semiconductor silicon-comprising region received between the semiconductor $Si_xGe_{(1-x)}$-comprising region and the gate dielectric. The semiconductor $Si_xGe_{(1-x)}$-comprising region has greater quantity of Ge than any quantity of Ge within the semiconductor silicon-comprising region. Other embodiments are contemplated, including methods of forming floating body field-effect transistors.

30 Claims, 22 Drawing Sheets

U.S. PATENT DOCUMENTS

| | | | |
|---|---|---|---|
| 7,098,507 | B2 | 8/2006 | Tang et al. |
| 7,109,544 | B2 | 9/2006 | Schloesser et al. |
| 7,170,807 | B2 | 1/2007 | Fazan et al. |
| 7,177,175 | B2 | 2/2007 | Fazan et al. |
| 7,184,298 | B2 | 2/2007 | Fazan et al. |
| 2003/0006461 | A1* | 1/2003 | Tezuka et al. ............... 257/347 |
| 2004/0061148 | A1 | 4/2004 | Hsu |
| 2005/0001257 | A1 | 1/2005 | Schloesser et al. |
| 2005/0040462 | A1 | 2/2005 | Koh |
| 2005/0285097 | A1* | 12/2005 | Shang et al. ............... 257/19 |
| 2006/0125011 | A1 | 6/2006 | Chang |
| 2006/0128105 | A1* | 6/2006 | Ouyang et al. ............... 438/300 |
| 2006/0175659 | A1 | 8/2006 | Sleight |
| 2006/0220085 | A1 | 10/2006 | Huo et al. |
| 2006/0231879 | A1 | 10/2006 | Forbes |
| 2006/0231893 | A1 | 10/2006 | Bernstein et al. |
| 2006/0231899 | A1 | 10/2006 | Chang et al. |
| 2006/0249770 | A1 | 11/2006 | Huo et al. |
| 2006/0252206 | A1 | 11/2006 | Forbes |
| 2006/0273391 | A1 | 12/2006 | Diaz et al. |
| 2007/0001165 | A1* | 1/2007 | Ranica et al. ............... 257/19 |
| 2007/0045697 | A1 | 3/2007 | Cheng et al. |

OTHER PUBLICATIONS

WO PCT/US2008/077027, Apr. 15, 2009, Written Opinion.
WO PCT/US2008/077027, Apr. 15, 2009, IPRP.
Balestra, F. et al., "Performance and New Effects in Advanced SOI Devices and Materials", Microelectronic Engineering 80 (2005), pp. 230-240.
Halfhill, T., "Z-RAM Shrinks Embedded Memory", Microprocessor Report, Oct. 25, 2005, pp. 1-4.
Numata, T. et al., "Performance Enhancement of Partially-and Fully-Depleted Strained-SOI MOSFETs and Characterization of Strained-Si Device Parameters", IEDM 2004 IEEE, pp. 177-180.
Ranica, R., et al., "A Capacitor-Less DRAM Cell on 75nm Gate Length, 16nm Thin Fully Depleted SOI Device for High Density Embedded Memories", IEEE Jan. 2004, 4 pages.
Shino, T. et al., "Fully-Depleted FBC (Floating Body Cell) with Enlarged Signal Window and Excellent Logic Process Compatibility", IEEE Jan. 2004, 4 pages.
Tanaka, T. et al., "Scalability Study on a Capacitorless 1T-DRAM: From Single-Gate PD-SOI to Double-Gate FinDRAM", IEDM 2004 IEEE, pp. 919-922.
Yoshida, E. et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, Apr. 2006, pp. 692-697.
Yoshimi, M. et al., "Advantages of Low Voltage Applications and Issues to be Solved in SOI Technology", Proceedings 1996 IEEE Internatl. SOI Conference, Oct. 1996, pp. 4-5.

* cited by examiner

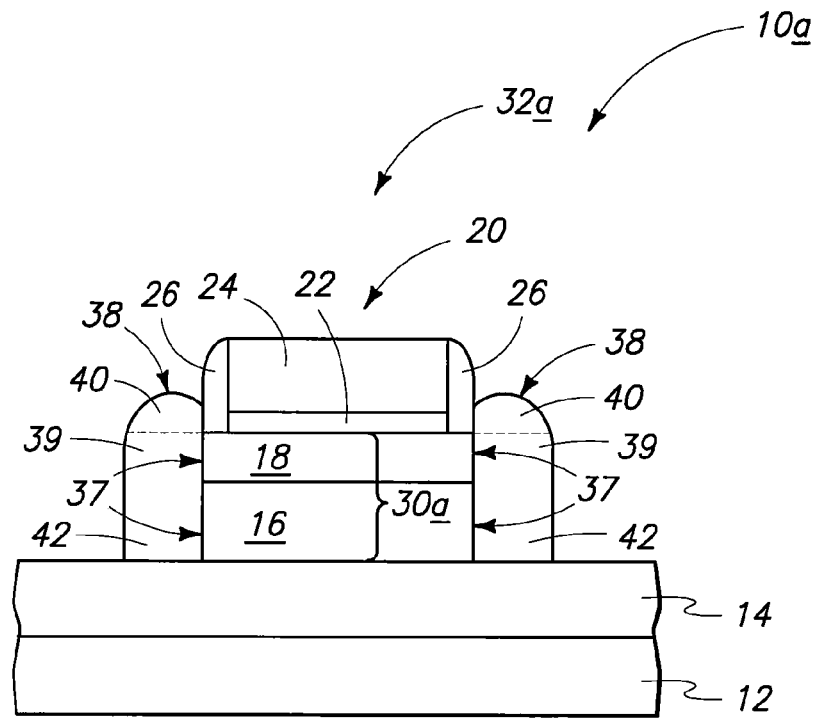
_FIG. 7_
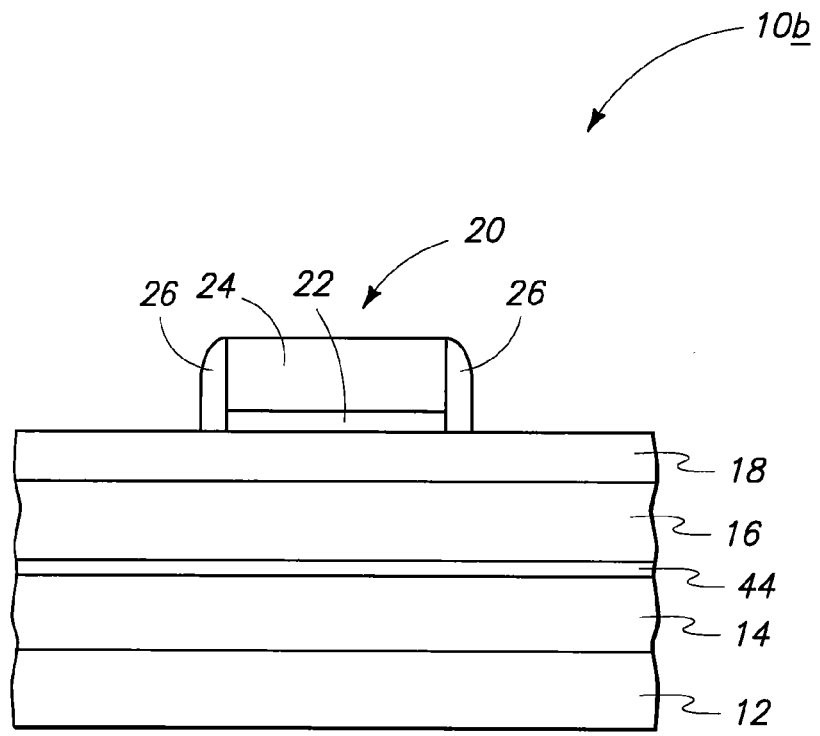
_FIG. 8_

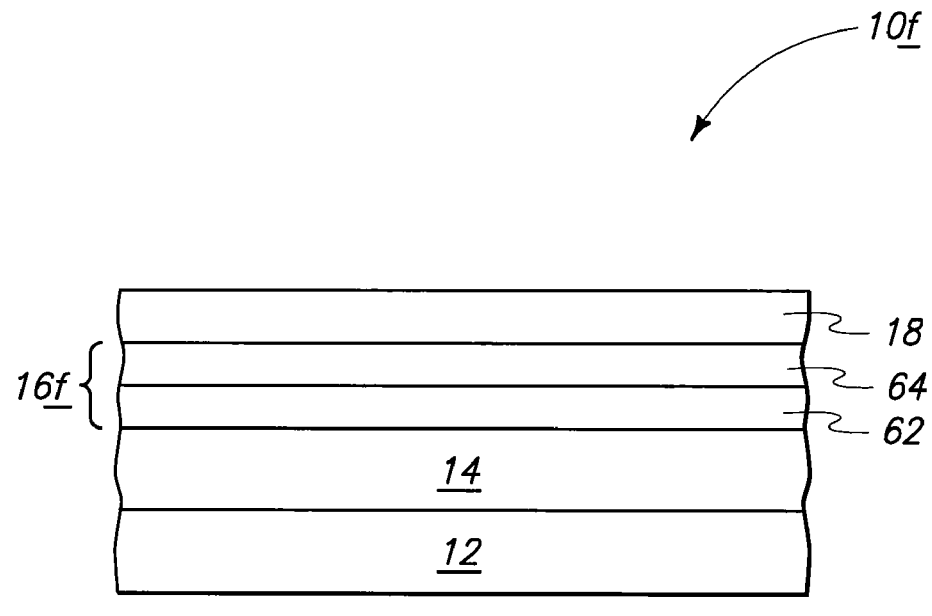
F I G 21
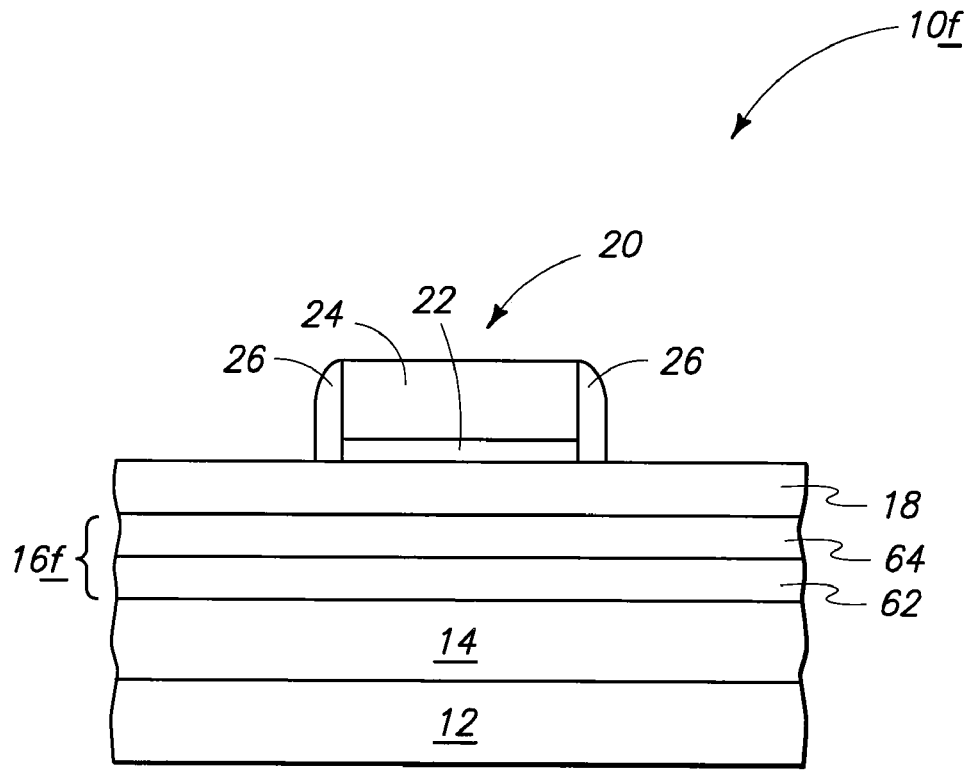
F I G 22

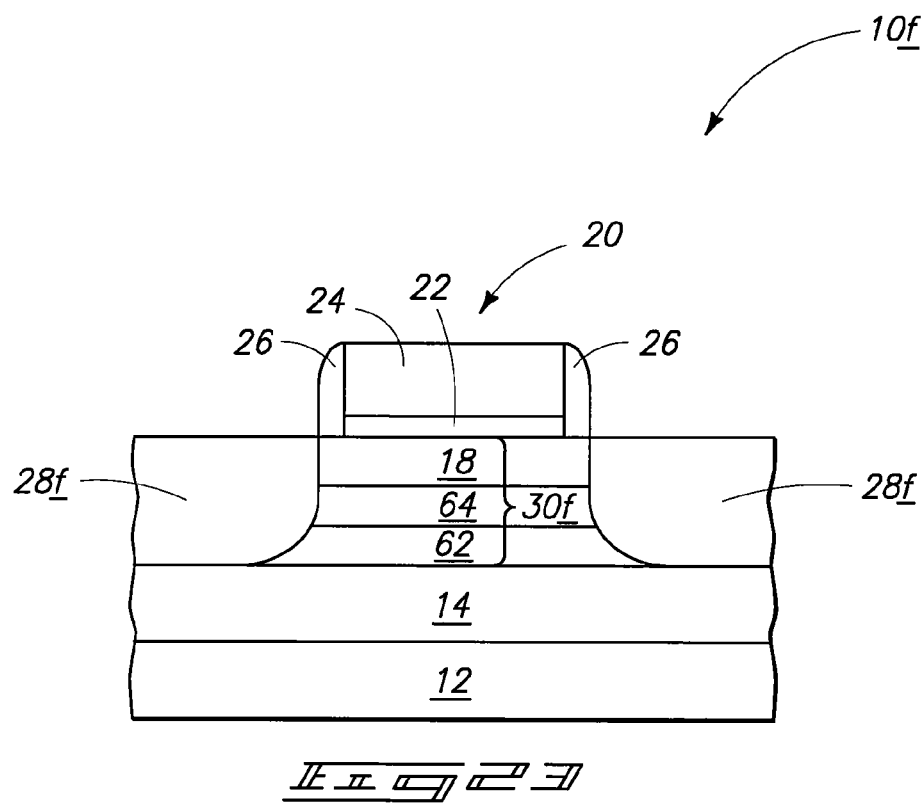
_Fig. 23_
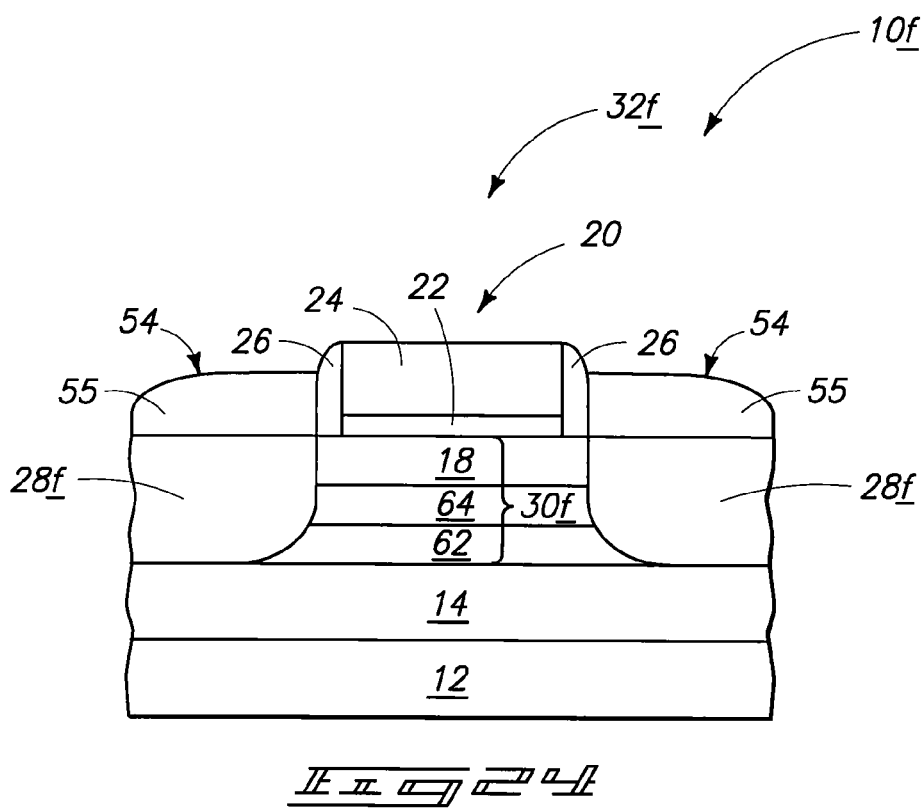
_Fig. 24_

US 7,948,008 B2

FLOATING BODY FIELD-EFFECT TRANSISTORS, AND METHODS OF FORMING FLOATING BODY FIELD-EFFECT TRANSISTORS

TECHNICAL FIELD

Embodiments disclosed herein pertain to floating body field-effect transistors, and to methods of forming floating body field-effect transistors.

BACKGROUND

One type of dynamic random access memory (DRAM) includes individual memory cells that include a field-effect transistor and a storage capacitor. As the size of integrated circuitry shrinks, the size of the capacitor also shrinks. Generally as the storage capacitor shrinks, the quantity of charge and the time which the charge can be retained decreases as well. Consequently, maintaining an acceptable level of performance of this type of DRAM structure becomes more difficult as the capacitor size decreases. Using capacitor dielectrics having high dielectric constants and increasing capacitor plate surface area through surface roughening, greater vertical dimensions, and other various capacitor shapes have been the conventional approaches to maintaining sufficiently high capacitance.

Another type of DRAM cell uses a structure which is void of a discrete storage capacitor. An example of a capacitor-less DRAM consists essentially of only a single transistor (1T) memory cell. Such DRAM cells use a semiconductor-on-insulator (SOI) structure for storing positive electrical charge in the form of "holes". The stored positive charge reduces the transistor threshold voltage ($V_t$), which is the voltage applied to the gate at which the channel region between the pair of source/drain regions becomes conductive. Accordingly, binary data states are represented in a 1T memory cell based on whether the transistor is switched "on" or remains "off" in response to a voltage applied to its gate during a memory read operation.

Various SOI 1T DRAM cell structures have been developed based on metal-oxide-semiconductor (MOS) field-effect transistor (FET) devices using a floating SOI channel body in which the holes accumulate. Accordingly, the source/drain regions are n-type, and the channel region is lightly doped p-type. These types of 1T DRAM cells are generally referred to as floating body cells (FBCs) due to the use of a floating SOI body. As accumulated holes lower the voltage at which the channel becomes conductive, a conductive channel is formed in the same floating SOI body in which the holes accumulate upon appropriate voltage application to the gate of the FET device. A data "1" is written by creating holes (for example, by impact ionization) and push up the body potential to a high level. Conversely, data "0" is written by extracting holes from the body which pulls the body potential down to a low level. By grounding the bit line and by applying negative voltage to the word line, body potential level which is either high or low is held for a certain time. The data can be distinguished using MOSFET current modulated by body potential.

The floating SOI channel body can be designed for use as partially depleted semiconductor-on-insulator (PDSOI) or fully depleted semiconductor-on-insulator (FDSOI), which refers to the extent of the formation of the conductive channel within thickness of the floating SOI body. In the case of FDSOI operation, negative substrate (plate) bias is applied so that the back surface of the semiconductor film accumulates holes. In the case of a partially depleted floating body cell (PDFBC), a neutral volume region exists. Accordingly, the neutral volume region is used in the case of PDFBC, and a bottom "plane" is used in the case of fully depleted floating body cell (FDFBC) for respective hole storage regions representing data states by potential level.

Regardless, writing a "1" to a floating body cell is achieved by voltage application in which excessive holes are stored in the floating body channel region of the FET. Conversely, application of different voltage potentials to the various FET components removes holes of the floating body channel region, thereby writing a "0". A mostly non-destructive read or data determination state of the FET is conducted typically utilizing a different set of voltage parameters particularly in which the voltage of one of the source/drain regions functioning as a drain is provided at lower voltage than at which such is provided during either a writing "1" operation or a writing "0" operation. There is a need for refresh of a written "1" due to hole loss due to injection into the source/drain because of the forward biased junction. Accordingly, any structure which facilitates quantity of hole storage and minimizes hole loss by any mechanism would be an improvement in the context of floating body field-effect transistors.

Floating body field-effect transistors might also be used in other than DRAM or in other than memory circuitry.

BRIEF DESCRIPTION OF THE DRAWINGS

FIG. 7 is a view of the FIG. 6 substrate at a processing step subsequent to that shown in FIG. 6.

FIG. 8 is a diagrammatic sectional view of another semiconductor substrate in process in accordance with an embodiment of the invention.

FIG. 21 is a diagrammatic sectional view of another semiconductor substrate in process in accordance with an embodiment of the invention.

FIG. 22 is a view of the FIG. 21 substrate at a processing step subsequent to that shown in FIG. 21.

FIG. 23 is a view of the FIG. 22 substrate at a processing step subsequent to that shown in FIG. 22.

FIG. 24 is a view of the FIG. 23 substrate at a processing step subsequent to that shown in FIG. 23.

DETAILED DESCRIPTION OF EXAMPLE EMBODIMENTS

Embodiments encompass methods of forming floating body field-effect transistors, for example for use as memory cells or in other circuitry, and floating body field-effect transistors independent of method of fabrication, also for example for use as memory cells or in other circuitry. Initial embodiments are described with reference to FIGS. 1-5.

Figure 1:
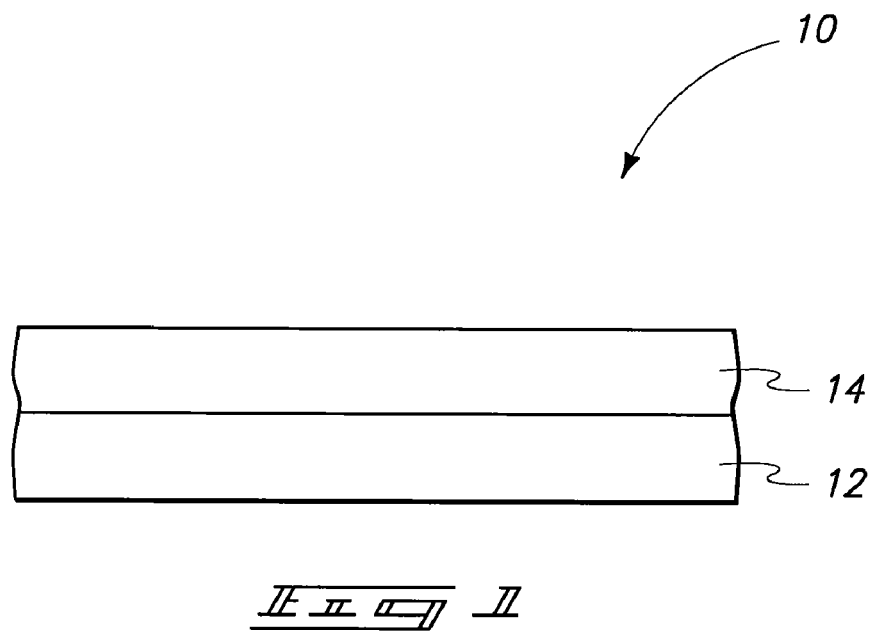
FIG. 1 is a diagrammatic sectional view of a semiconductor substrate in process in accordance with an embodiment of the invention.

Referring to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is depicted as comprising a semiconductor region 12 having an insulator 14 formed thereover. An example semiconductor material 12 is doped or undoped monocrystalline silicon (including for example bulk monocrystalline silicon), and an example insulator 14 is silicon dioxide. By way of example only, a thickness range for insulator 14 is from about 30 Angstroms to about 5,000 Angstroms.

Figure 2:
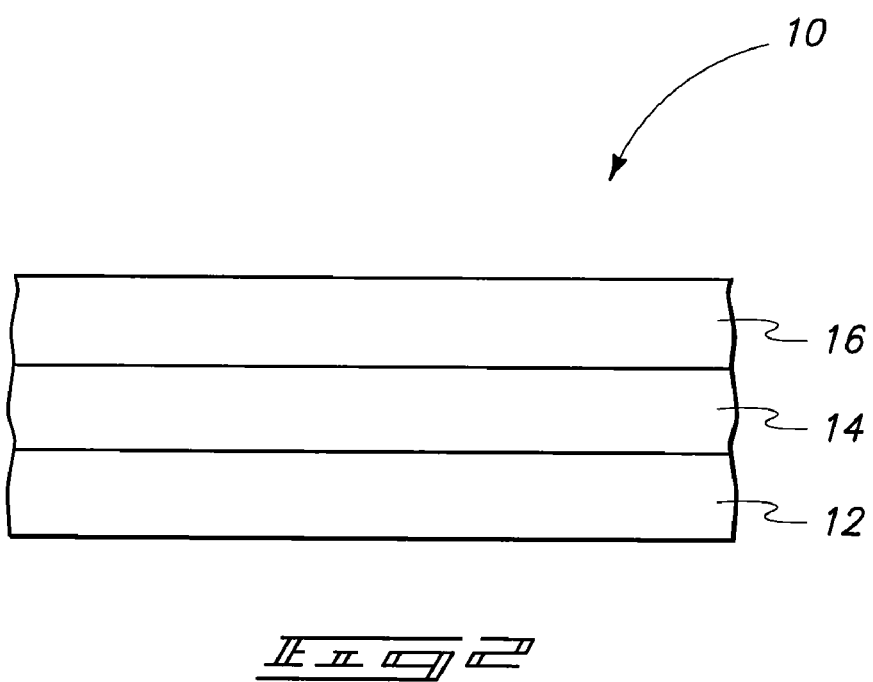
FIG. 2 is a view of the FIG. 1 substrate at a processing step subsequent to that shown in FIG. 1.

Referring to FIG. 2, a semiconductor $Si_xGe_{(1-x)}$-comprising layer 16 has been formed over insulator 14. Such might be provided by any existing or yet-to-be developed manner. Existing examples may include physical vapor deposition, chemical vapor deposition, atomic layer deposition, and/or epitaxial deposition or lateral overgrowth, and by way of examples only. One specific manner of depositing a $Si_xGe_{(1-x)}$-comprising layer 16 includes epitaxial growth wherein a suitable seed layer is provided over insulator 14, with $Si_xGe_{(1-x)}$-comprising layer 16 being epitaxially grown therefrom by using a silane and a germane as feed gases with the relative portions thereof determining silicon and germanium concentration within $Si_xGe_{(1-x)}$-comprising layer 16. By way of example only, embodiments of the invention include where x is at least 0.5, at least 0.7, no greater than 0.85, no greater than 0.8, and from 0.7 to 0.85. Regardless, FIG. 2 depicts an embodiment wherein semiconductor $Si_xGe_{(1-x)}$-comprising layer 16 is formed to be received directly physically contacting against insulator 14. Additional embodiments are contemplated wherein semiconductor $Si_xGe_{(1-x)}$-comprising layer 16 is not received directly physically contacting against insulator 14, and including where some of the base of semiconductor $Si_xGe_{(1-x)}$-comprising layer 16 contacts insulator 14 and some does not. Further by way of example only, semiconductor $Si_xGe_{(1-x)}$-comprising layer 16 might be formed to be homogenous at least regarding Ge concentration, or formed to not be homogenous at least regarding Ge concentration. Further by way of example only, semiconductor $Si_xGe_{(1-x)}$-comprising layer 16 might be formed to be entirely homogenous as respects all its components.

Figure 3:
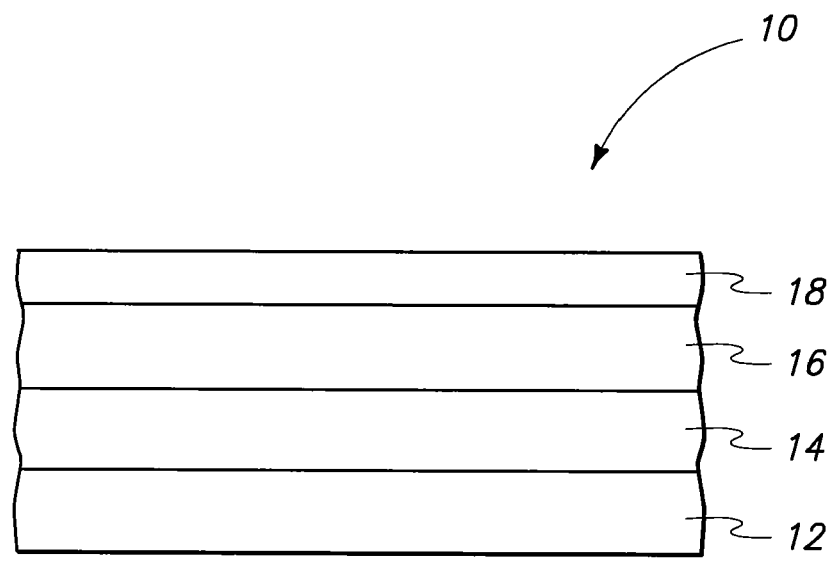
FIG. 3 is a view of the FIG. 2 substrate at a processing step subsequent to that shown in FIG. 2.

Referring to FIG. 3, a semiconductor silicon-comprising layer 18 has been formed over and in direct physical contact with semiconductor $Si_xGe_{(1-x)}$-comprising layer 16. Semiconductor $Si_xGe_{(1-x)}$-comprising layer 16 has a greater quantity of Ge than any quantity of Ge within semiconductor silicon-comprising layer 18. Accordingly, semiconductor silicon-comprising layer 18 may contain some quantity of Ge or may be void of Ge. In the context of this document, "void of Ge" defines no detectable Ge being present within a silicon-comprising layer such as layer 18. In one embodiment, semiconductor silicon-comprising layer 18 is void of Ge. In one embodiment, semiconductor silicon-comprising layer 18 comprises Ge, but ideally in considerably lower concentration than present in $Si_xGe_{(1-x)}$-comprising layer 16. Example embodiments include Ge quantity in semiconductor silicon-comprising layer 18 being less than about 10 atomic percent, less than about 1 atomic percent, less than 0.1 atomic percent, and being void of Ge.

Figure 4:
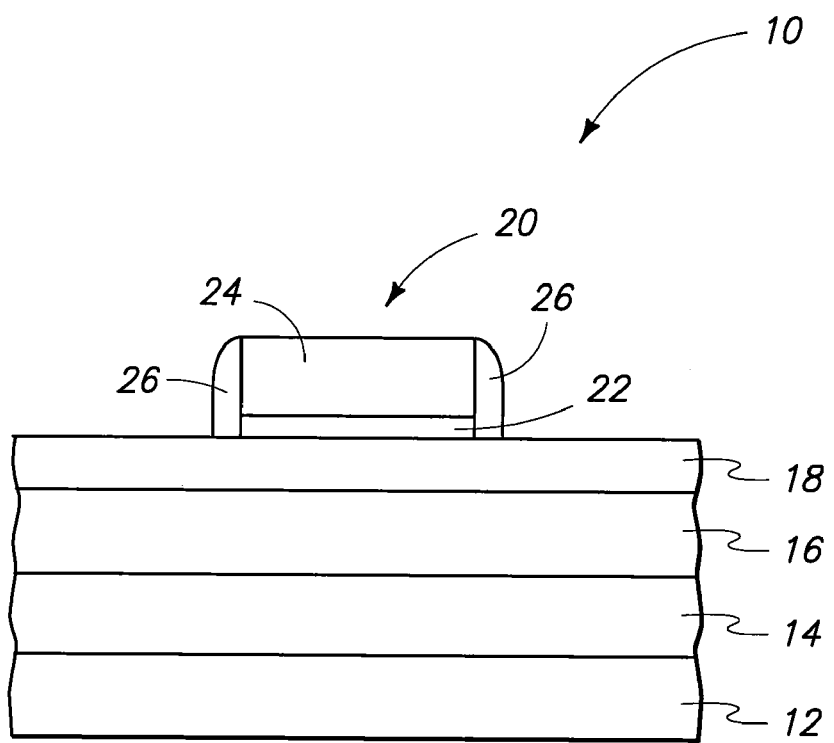
FIG. 4 is a view of the FIG. 3 substrate at a processing step subsequent to that shown in FIG. 3.

Referring to FIG. 4, a gate construction 20 has been formed over semiconductor silicon-comprising layer 18. Such is depicted as comprising a gate dielectric 22 having a conductive gate electrode 24 formed thereover. Gate electrode 24 might comprise one or a combination of conductively doped semiconductive material, elemental metal, alloys of elemental metals, and/or conductive metal compounds. Further by way of example only, an insulative cap over gate electrode 24 (not shown) might be associated with gate construction 20. Gate construction 20 is also depicted as comprising anisotropically etched insulative sidewall spacers 26 formed about sidewalls of gate electrode 24 and gate dielectric 22. By way of example only, LDD, halo, and/or other implants into one or both of semiconductor silicon-comprising layer 18 and $Si_xGe_{(1-x)}$-comprising layer 16 might be conducted prior to or after formation of example anisotropically etched insulative sidewall spacers 26.

Figure 5:
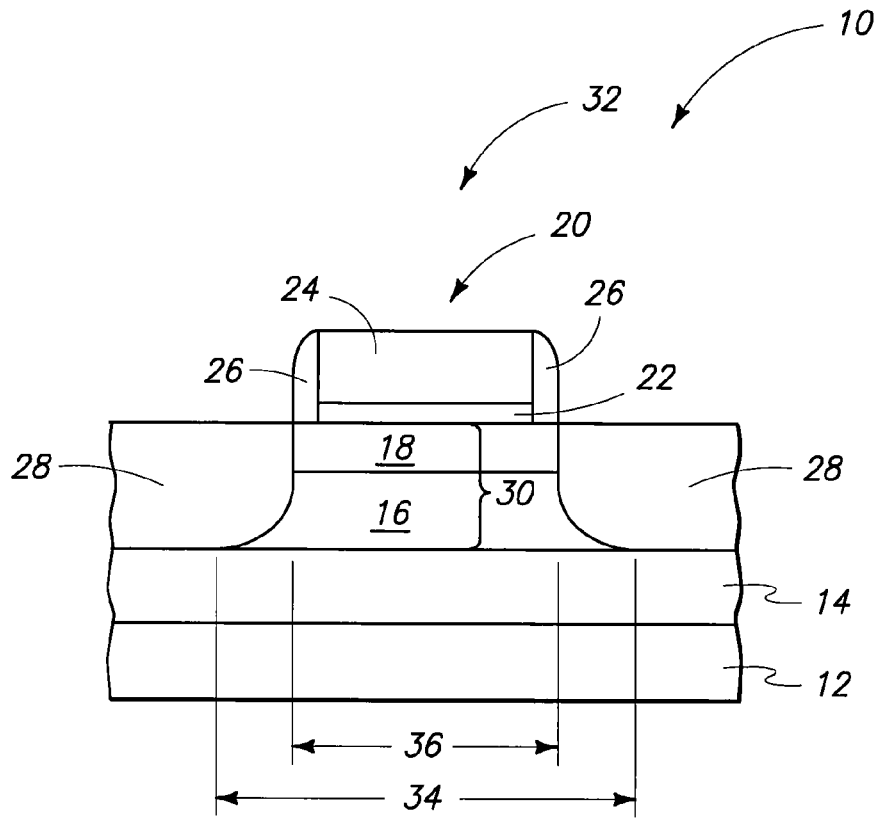
FIG. 5 is a view of the FIG. 4 substrate at a processing step subsequent to that shown in FIG. 4.

Referring to FIG. 5, a pair of source/drain regions 28 and a floating body channel region 30 therebetween have been formed using gate dielectric 22 and gate electrode 24 at least in part as a mask. In the context of this document, a source/drain region is any source region and/or drain region of a field-effect transistor which will function as one or both of a source and drain during current flow through the channel region of the FET. Accordingly, a source/drain region in operation might always function as either a source or a drain of a field-effect transistor, or circuitry construction and operation might be provided wherein in some operational regimes a source becomes a drain and a drain becomes a source. In the context of this document, a floating body channel region is that portion of the FET capable of operating as a conductive channel upon suitable application of gate voltage and which includes some portion thereof operable for a hole storage in a hole storage region whether operating in a fully depleted or partially depleted mode.

FIG. 5 depicts an embodiment wherein ion implanting of n-type conductivity enhancing impurity has been conducted into unmasked portions of semiconductor silicon-comprising layer 18 and semiconductor $Si_xGe_{(1-x)}$-comprising layer 16 to form a pair of highest dopant concentration n-type source/drain regions 28 using gate dielectric 22 and gate electrode 24 at least in part as a mask during such ion implanting. In the depicted embodiment, insulative sidewall spacers 26 have also effectively been used at least in part as a mask during such implanting. Additional masking might also be used. Regardless, in the FIGS. 1-5 embodiments, a pair of highest dopant concentration n-type source/drain regions 28 comprises both semiconductor silicon-comprising layer 18 and $Si_xGe_{(1-x)}$-comprising layer 16 which have been suitably highly conductively doped to be capable of functioning as source/drain regions. Floating body channel region 30 comprises semiconductor silicon-comprising layer 18 and $Si_xGe_{(1-x)}$-comprising layer 16.

Accordingly and by way of example only, FIG. 5 depicts one embodiment floating body field-effect transistor 32. Such comprises a pair of source/drain regions 28 having a floating body channel region 30 received therebetween. Source/drain regions 28 and floating body channel region 30 are received over an insulator 14. A gate electrode 24 is received proximate floating body channel region 30, with "proximate" in the context of this document requiring being in operable closeness to a floating body channel region to enable operation of the field-effect transistor to selectively cause current flow through some portion of the channel region. A gate dielectric 22 is received between gate electrode 24 and floating body channel region 30.

Floating body channel region 30 comprises a semiconductor $Si_xGe_{(1-x)}$-comprising region 16 and a semiconductor silicon-comprising region 18 received between semiconductor $Si_xGe_{(1-x)}$-comprising region 16 and gate dielectric 22. Semiconductor $Si_xGe_{(1-x)}$-comprising region 16 has greater quantity of Ge than any quantity of Ge within semiconductor silicon-comprising region 18 as explained fully above.

In one embodiment, $Si_xGe_{(1-x)}$-comprising region 16 has a thickness of at least 20 Angstroms, and in one embodiment has a thickness of from about 100 Angstroms to about 600 Angstroms. In one embodiment wherein the transistor is partially depleted in operation, semiconductor $Si_xGe_{(1-x)}$-comprising region 16 has a thickness of from about 300 Angstroms to about 600 Angstroms. In one embodiment wherein the transistor is fully depleted in operation, semiconductor $Si_xGe_{(1-x)}$-comprising region 16 has a thickness of from about 100 Angstroms to about 300 Angstroms. In one embodiment where semiconductor $Si_xGe_{(1-x)}$-comprising region 16 has a thickness of from about 20 Angstroms to about 50 Angstroms, x is from 0.5 to 0.6.

In one embodiment, $Si_xGe_{(1-x)}$-comprising region 16 has a thickness which is from about 25% to about 75% of total thickness of floating body channel region 30. Semiconductor $Si_xGe_{(1-x)}$-comprising region 16 may have a thickness which is about equal to, less than, or greater than (as shown) that of semiconductor silicon-comprising region 18. Semiconductor $Si_xGe_{(1-x)}$-comprising region 16 and semiconductor silicon-comprising region 18 might be provided to have the same maximum widths, or different maximum widths. For example and by way of example only, FIG. 5 depicts semiconductor $Si_xGe_{(1-x)}$-comprising region 16 having a greater maximum width 34 than a maximum width 36 of semiconductor silicon-comprising region 18. This size relationship might of course be reversed, or the maximum widths made equal.

Without being limited to any advantages or theory of operation, constructions as provided above and in certain embodiments below might enhance floating body field-effect transistor operation. For example, the band gap offset between $Si_xGe_{(1-x)}$ and silicon (that has low or no Ge content) lies in the valence band with type II alignment, thereby forming a SiGe potential well for excessive holes which as a result of channel hot electron impact ionization are stored in the bottom $Si_xGe_{(1-x)}$ potential well. Further, a smaller source/drain junction in a thin $Si_xGe_{(1-x)}$-comprising floating body channel might be provided and result in less hole dissipation and longer refresh time than in a floating body channel region the entirety of which is homogenous and predominantly comprises silicon, or in a floating body channel region which is homogenous and predominantly comprises $Si_xGe_{(1-x)}$. Further, the above attributes are applicable in both partially depleted SOI and fully depleted SOI floating body cells.

Figure 6:
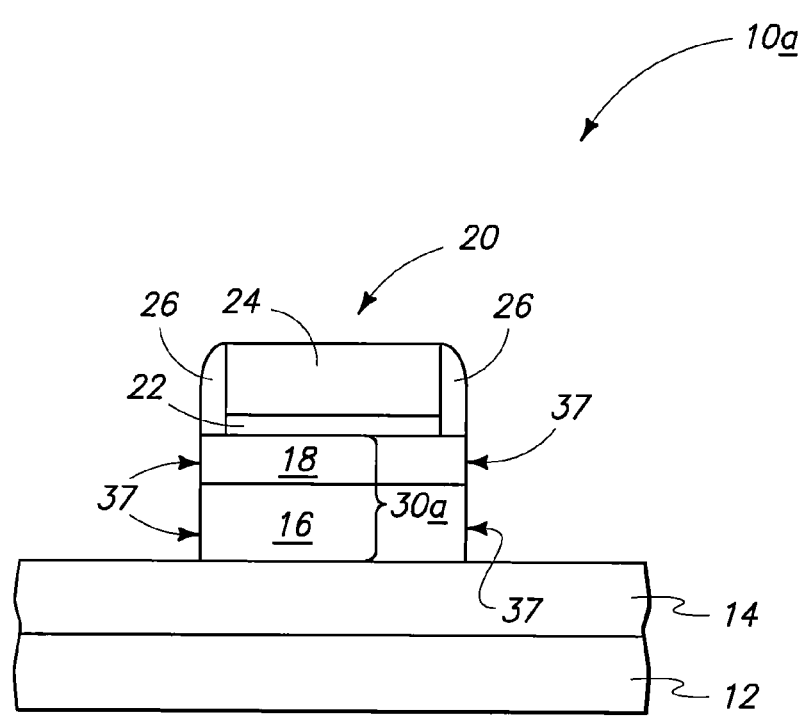
FIG. 6 is a diagrammatic sectional view of another semiconductor substrate in process in accordance with an embodiment of the invention.

Further embodiments are next described with reference to FIGS. 6 and 7. Like numerals from the above first described embodiments are utilized where appropriate, with differences being indicated with the suffix "a" or with different numerals. FIG. 6 depicts a semiconductor substrate 10a at a processing step subsequent to that depicted by FIG. 4 and alternate to that depicted by FIG. 5. FIG. 6 depicts etching into unmasked portions of semiconductor silicon-comprising layer 18 and semiconductor $Si_xGe_{(1-x)}$-comprising layer 16 using gate dielectric 22 and gate electrode 24 at least in part as a mask for such etching. Such also depicts using anisotropically etched insulative sidewall spacers 26 as masking for such etching, and the forming of floating body channel region 30a which comprises semiconductor silicon-comprising layer 18 and semiconductor $Si_xGe_{(1-x)}$-comprising layer 16. In FIG. 6 and for purposes of the continuing discussion, such can be considered as comprising respective laterally outermost sidewalls 37.

After the etching, semiconductive silicon-comprising material is epitaxially grown from laterally outermost sidewalls of at least the silicon-comprising layer to form a pair of source/drain regions. FIG. 7 depicts one example wherein semiconductive silicon-comprising material 39 has been epitaxially grown from laterally outermost sidewalls 37 of both silicon-comprising layer 18 and $Si_xGe_{(1-x)}$-comprising layer 16 to form a pair of source/drain regions 38. Semiconductive silicon-comprising material 39 might comprise any of the materials described above with respect to layers 18 and 16, and ideally includes low Ge quantity or is void of Ge as described above. Regardless and further in the depicted example FIG. 7 embodiment, pair of source/drain regions 38 can be considered as respectively comprising an elevated source/drain portion 40 and a non-elevated source/drain portion 42.

Figure 9:
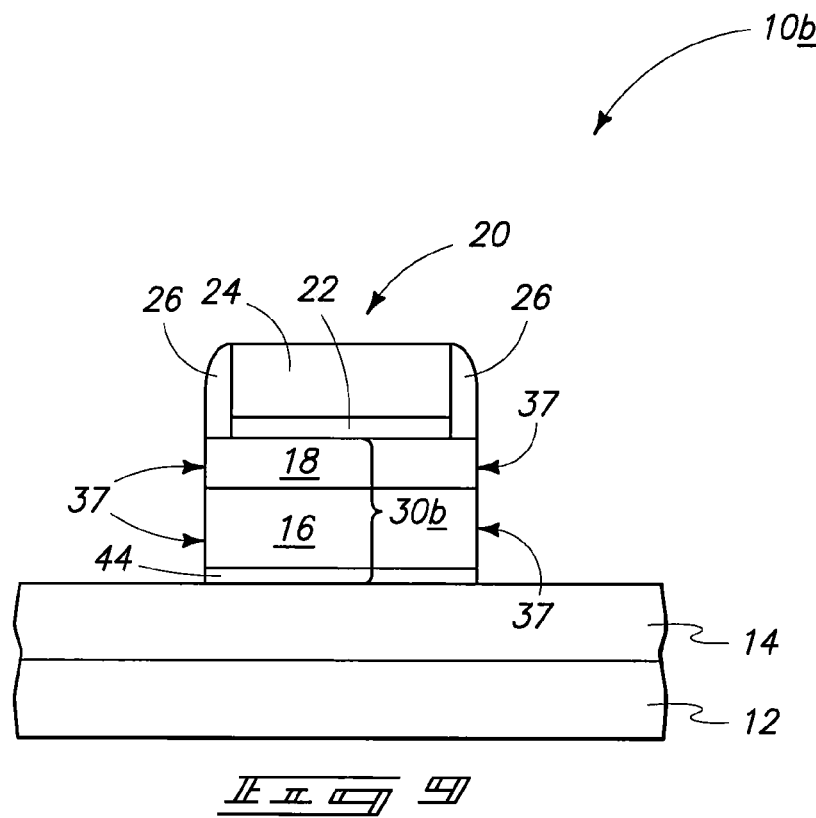
FIG. 9 is a view of the FIG. 8 substrate at a processing step subsequent to that shown in FIG. 8.

Further embodiments are next described with reference to FIGS. 8-10 with respect to a semiconductor substrate 10b. Like numerals from the first described embodiment have been utilized where appropriate, with differences being indicated with a suffix "b" or with different numerals. FIG. 8 depicts alternate processing to that depicted at least in FIG. 4. In FIG. 8, another semiconductor silicon-comprising layer 44 has been provided to be received between semiconductor $Si_xGe_{(1-x)}$-comprising layer 16 and insulator 14. Semiconductor $Si_xGe_{(1-x)}$-comprising layer 16 is provided to have greater quantity of Ge than any quantity of Ge within such another semiconductor silicon-comprising layer 44. Accordingly, example attributes as respects Ge quantity in layer 44 are the same as that described above with respect to semiconductor silicon-comprising layer 18, although layer 18 and 44 may have different respective Ge quantities, if any. By way of example only, a thickness range for layer 44 is from about 20 Angstroms to about 100 Angstroms. Further and regardless, FIG. 8 depicts an example embodiment wherein semiconductor $Si_xGe_{(1-x)}$-comprising region 16 is not received directly physically contacting against insulator 14.

Processing may occur subsequent to FIG. 8 in accordance with FIG. 5 and/or FIGS. 6-7, or otherwise, in fabrication of a floating body channel region. By way of example only, FIG. 9 depicts processing corresponding to that of FIG. 6 in formation of a floating body channel region 30b. FIG. 10 depicts processing corresponding to that of FIG. 7 in the fabrication of a pair of source/drain regions 38.

Figure 11:
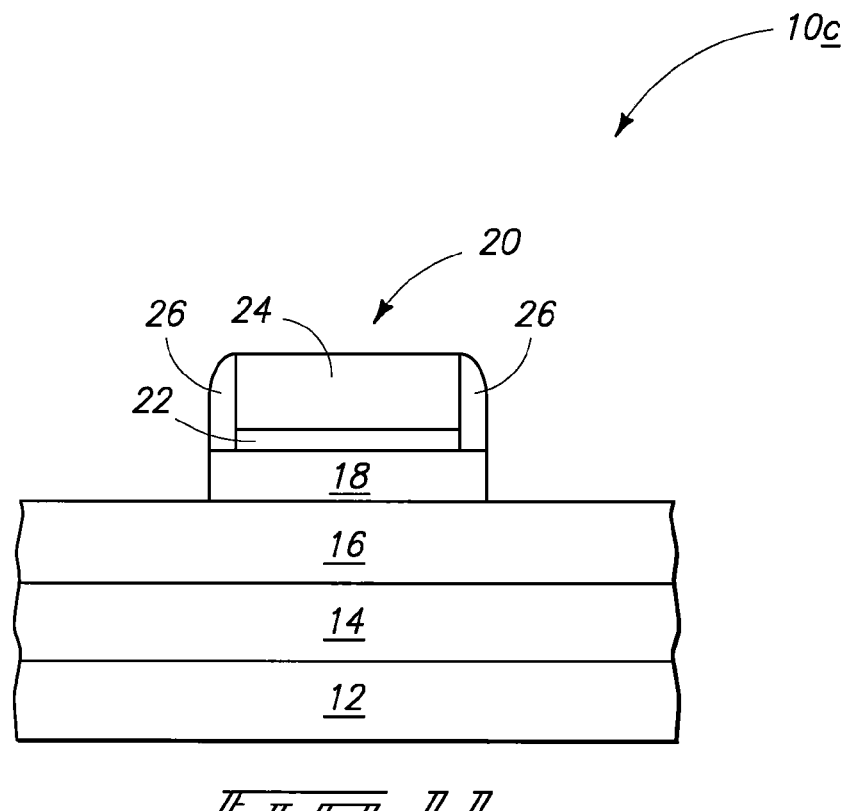
FIG. 11 is a diagrammatic sectional view of another semiconductor substrate in process in accordance with an embodiment of the invention.

Further embodiments of the invention are next described with reference to FIGS. 11-16. FIG. 11 depicts processing of the FIG. 4 substrate to produce an alternate construction to that depicted by FIG. 6 in conjunction with a semiconductor substrate 10c. Like numerals from the first described embodiments have been utilized where appropriate, with differences being indicated with the suffix "c" or with different numerals. In the context of FIG. 11, anisotropically etched sidewall spacers 26 might be considered as first sidewall spacers formed over sidewalls of gate electrode 24. FIGS. 11-16 depict an embodiment wherein etching occurs into unmasked portions of the semiconductor silicon-comprising layer and the semiconductor $Si_xGe_{(1-x)}$-comprising layer to form a floating body channel region comprising such layers using the gate dielectric and the gate electrode at least in part as a mask. FIG. 11 illustrates first etching having been conducted through semiconductor silicon-comprising layer 18 at least to semiconductor $Si_xGe_{(1-x)}$-comprising layer 16 using gate dielectric 22, gate electrode 24, and first sidewall spacers 26 at least in part as masking during such etching. Such might, by way of example only, be conducted as a timed etch, or an etching chemistry selected to selectively etch silicon-comprising layer 18 selectively relative to $Si_xGe_{(1-x)}$-comprising layer 16. Example selective etching chemistries for doing so include plasma using either a $SF_6$, $H_2$, and $CF_4$ mixture or a $CF_4$, $CH_2F_2$, $N_2$, and $O_2$ mixture.

Figure 12:
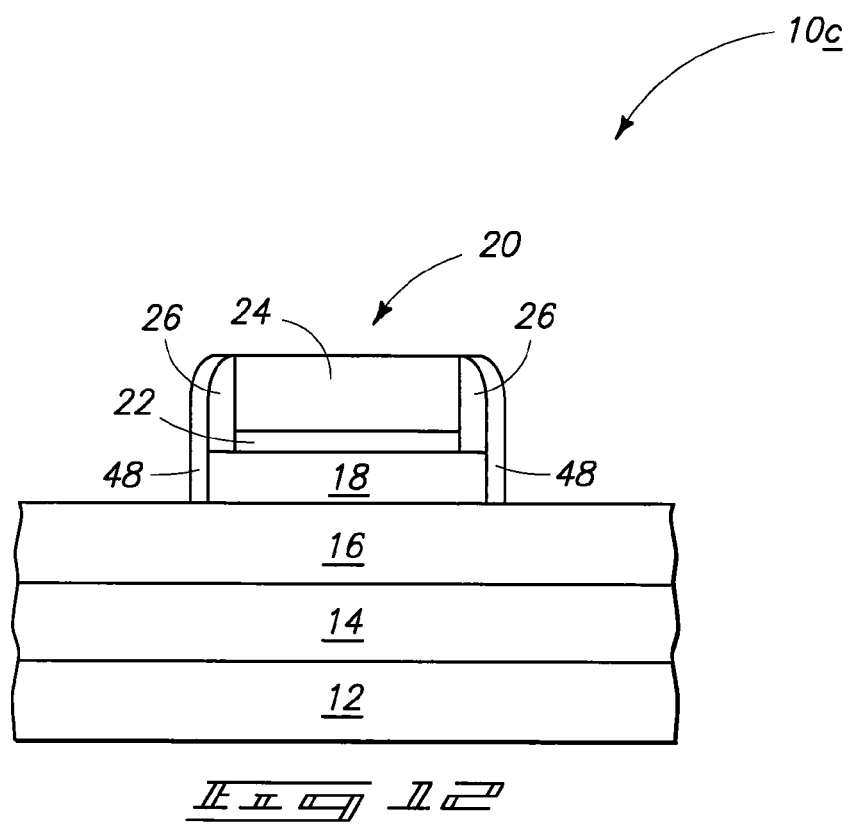
FIG. 12 is a view of the FIG. 11 substrate at a processing step subsequent to that shown in FIG. 11.

Referring to FIG. 12, second sidewall spacers 48 have been formed over first sidewall spacers 26 and over sidewalls of etched-through semiconductor silicon-comprising layer 18. An example technique for doing so includes deposition and maskless anisotropic etch. In one embodiment, second sidewall spacers 48 are ideally selectively etchable relative to first sidewall spacers 26.

Figure 13:
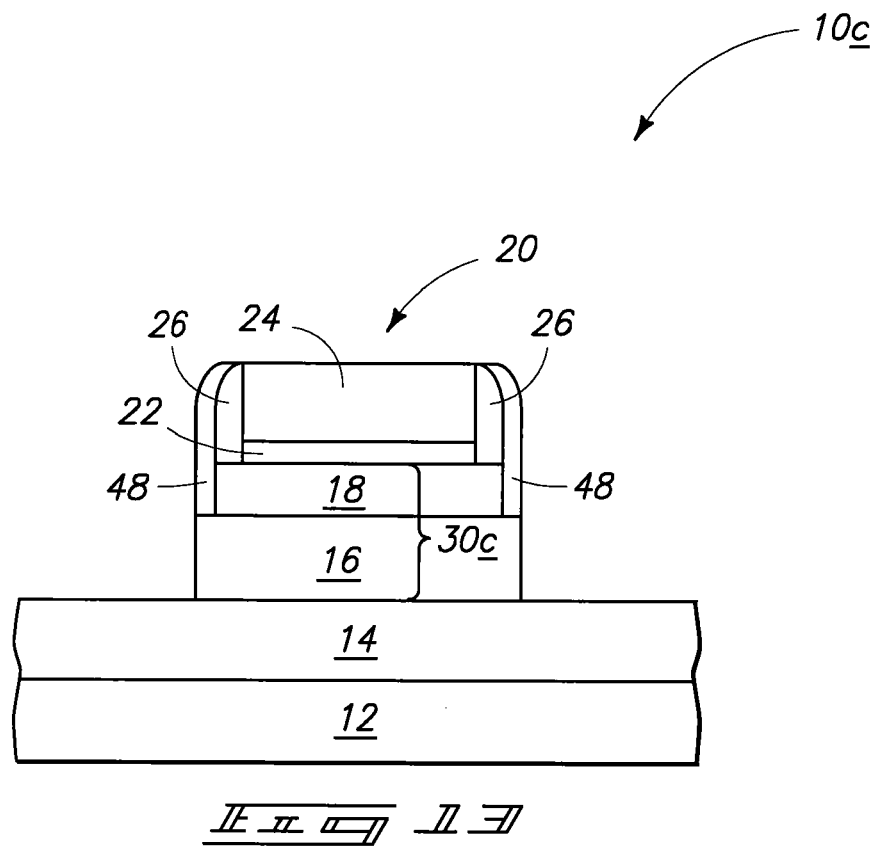
FIG. 13 is a view of the FIG. 12 substrate at a processing step subsequent to that shown in FIG. 12.

Referring to FIG. 13, a second etching has been conducted, this time through at least some of semiconductor $Si_xGe_{(1-x)}$-comprising layer 16 using gate dielectric 22, gate electrode 24, first sidewall spacers 26, and second sidewall spacers 48 at least in part as masking during such etching. FIG. 13 depicts one example embodiment wherein $Si_xGe_{(1-x)}$-comprising layer 16 is completely etched through to insulator 14, and forms a floating body channel region 30c.

Figure 14:
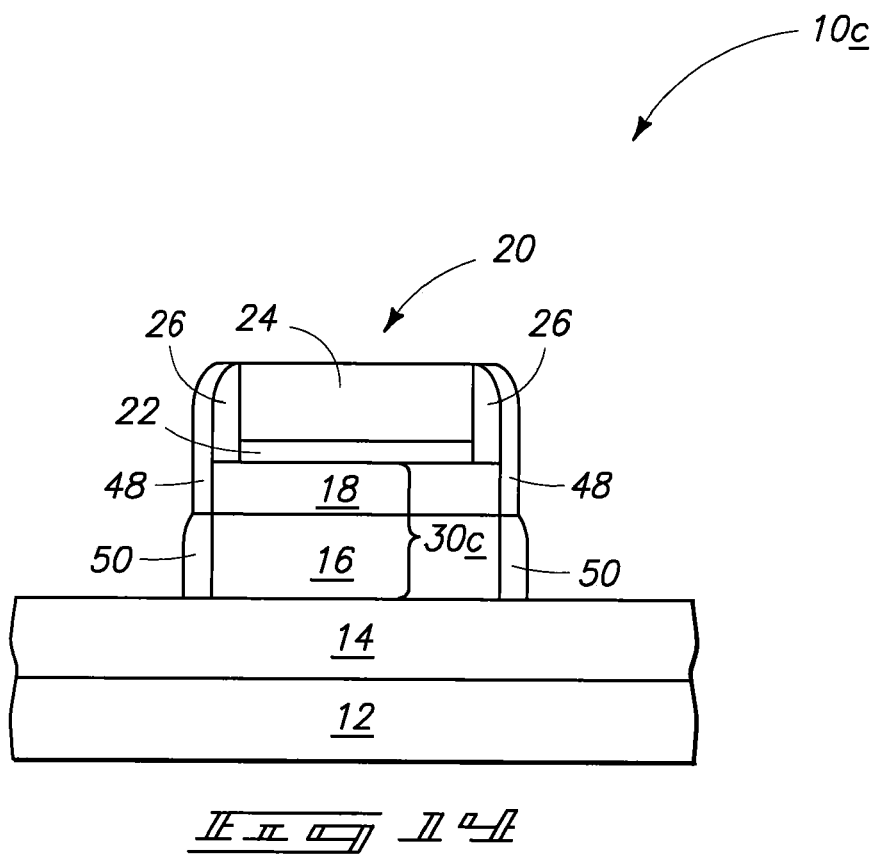
FIG. 14 is a view of the FIG. 13 substrate at a processing step subsequent to that shown in FIG. 13.

Referring to FIG. 14, insulative material 50 has been formed over sidewalls of semiconductor $Si_xGe_{(1-x)}$-comprising layer 16. An example technique for doing so includes exposure to oxidizing conditions effective to thermally oxidize such sidewalls, thereby forming an insulative silicon-germanium oxide material. An example lateral thickness range for insulative material 50 is from about 30 Angstroms to about 300 Angstroms.

Figure 15:
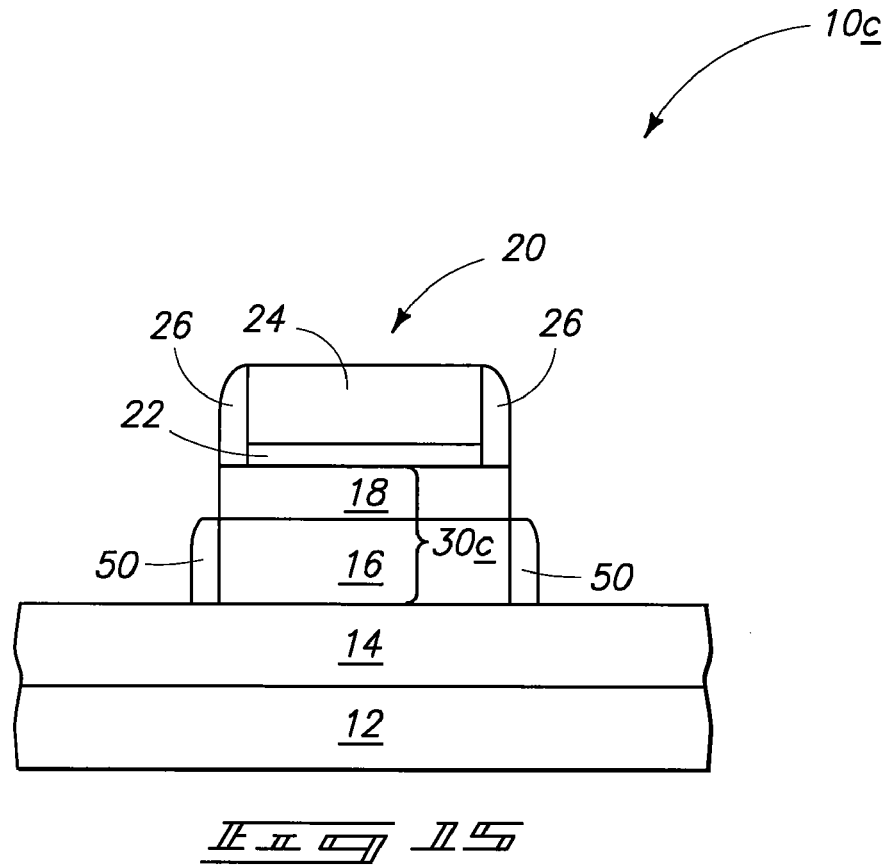
FIG. 15 is a view of the FIG. 14 substrate at a processing step subsequent to that shown in FIG. 14.

Referring to FIG. 15, second sidewall spacers 48 (not shown) have been etched to expose sidewalls of semiconductor silicon-comprising layer 18. Where, for example, insulative material 50 comprises a silicon-germanium oxide, first spacers 26 comprise silicon dioxide, and second spacers 48 comprise silicon nitride, an example etching to produce the FIG. 15 construction includes a mixture of $H_3PO_4$ and $H_2O$ heated to from about 150° C. to about 180° C.

Figure 16:
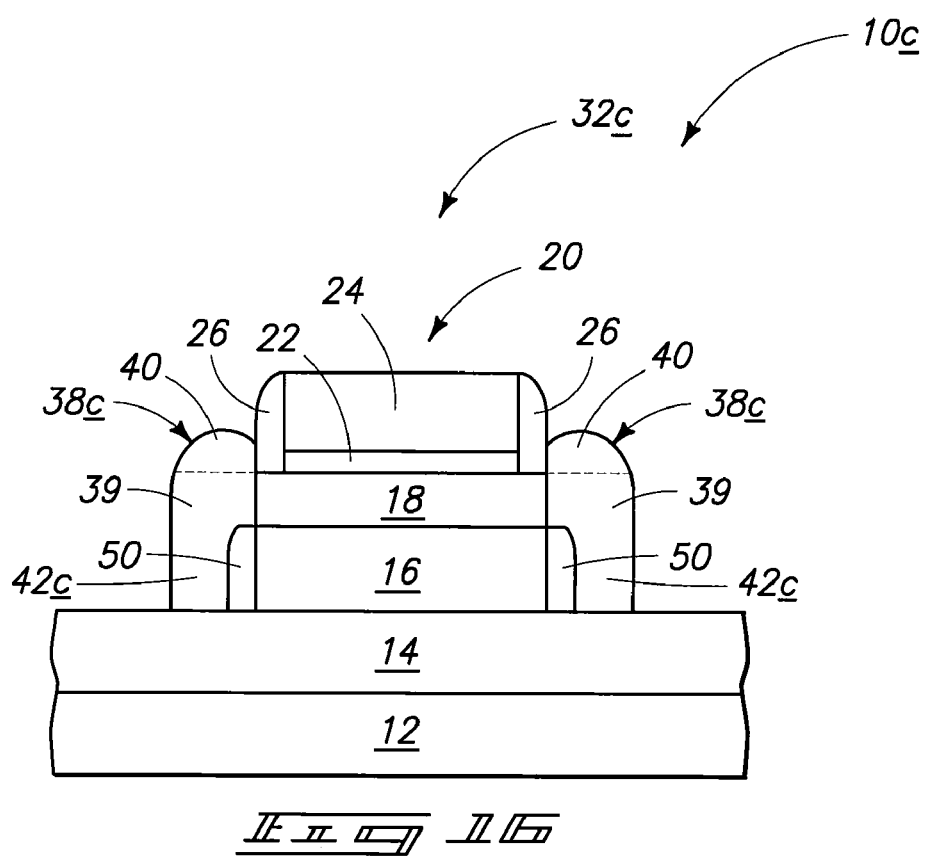
FIG. 16 is a view of the FIG. 15 substrate at a processing step subsequent to that shown in FIG. 15.

Referring to FIG. 16, semiconductive silicon-comprising material 39 has been epitaxially grown from laterally outermost sidewalls of only silicon-comprising layer 18 (since sidewalls of semiconductor $Si_xGe_{(1-x)}$-comprising layer 16 are covered with insulator 50) to form a pair of source/drain regions 38c.

Figure 10:
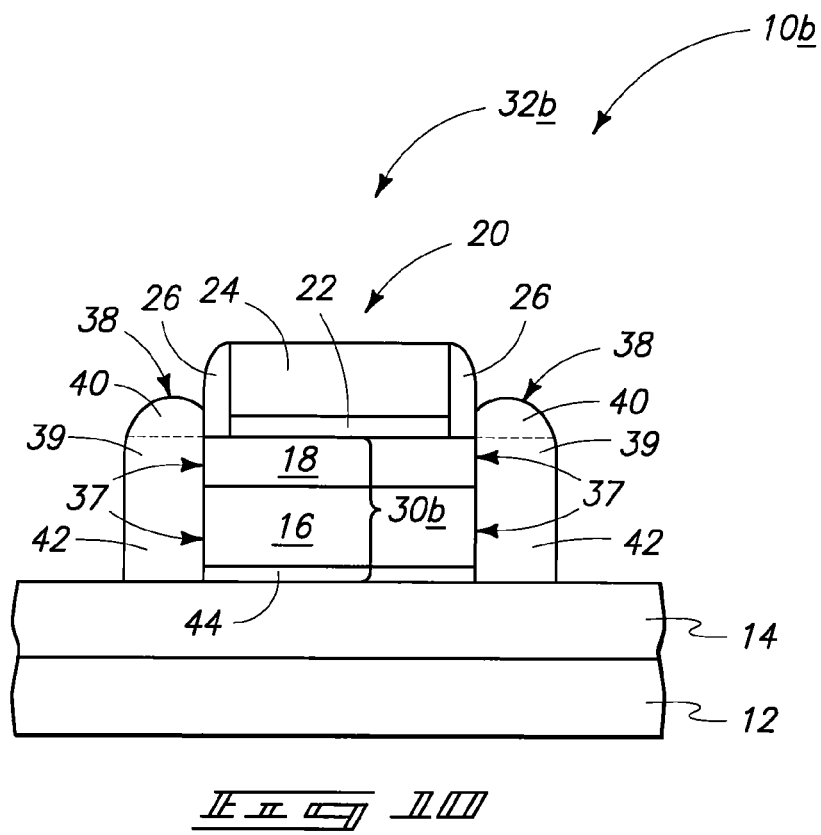
FIG. 10 is a view of the FIG. 9 substrate at a processing step subsequent to that shown in FIG. 9.

Accordingly and by way of example only, FIGS. 5, 7, and 10 depict example embodiments wherein semiconductor $Si_xGe_{(1-x)}$-comprising region 16 of a respective floating body channel region comprises laterally outermost sidewalls which directly physically contact against the respective source/drain regions. On the other hand, FIG. 16 depicts an example embodiment wherein semiconductor $Si_xGe_{(1-x)}$-comprising region 16 of a floating body channel region comprises laterally outermost sidewalls which do not directly physically contact against the source/drain regions. For example and by way of example only, the FIG. 16 embodiment depicts insulative material 50 being received between at least some of the laterally outermost sidewalls of the semiconductor $Si_xGe_{(1-x)}$-comprising region 16 and the source/drain regions 38c, with FIG. 16 more specifically illustrating insulative material 50 being received between all of the laterally outermost sidewalls of the semiconductor $Si_xGe_{(1-x)}$-comprising region 16 and the source/drain regions 38c.

Figure 17:
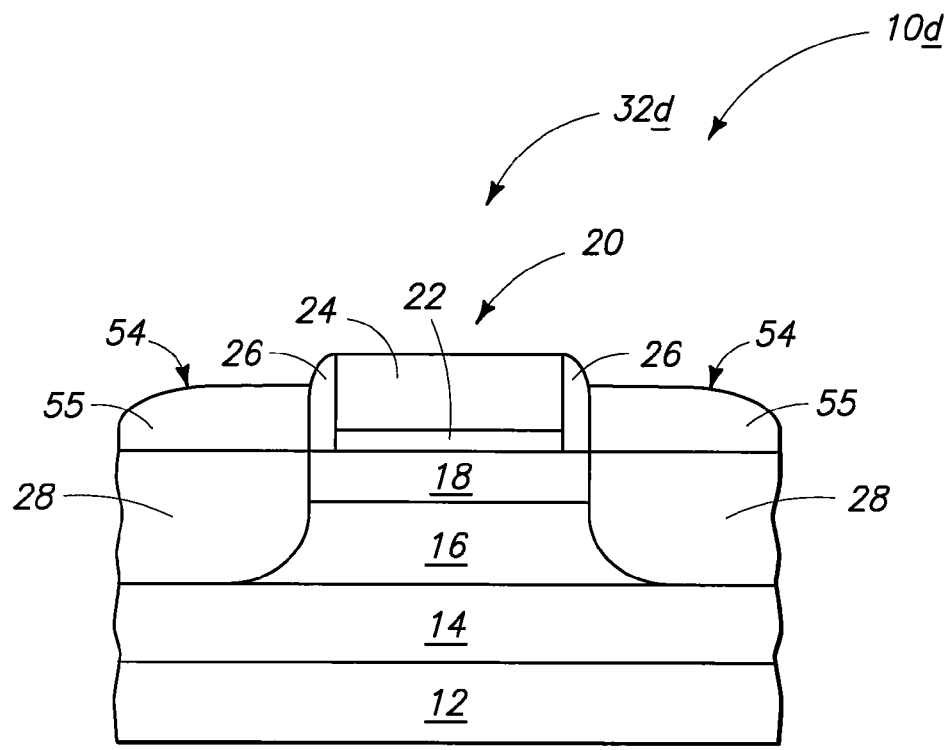
FIG. 17 is a diagrammatic sectional view of another semiconductor substrate in process in accordance with an embodiment of the invention.

Further example embodiments are next described with reference to FIG. 17 with respect to a semiconductor substrate 10d. Like numerals from the above-described embodiments are utilized where appropriate, with differences being indicated with the suffix "d" or with different numerals. FIG. 17 depicts processing subsequent to that depicted by FIG. 5, although such FIG. 17 processing could be conducted subsequent to any of that depicted by FIG. 7, 10, or 16, by way of examples only. In FIG. 17, a semiconductor $Si_xGe_{(1-x)}$-comprising material 54 has been epitaxially grown outwardly from silicon-comprising pair of highest dopant concentration n-type source/drain regions 28 to form elevated source/drain portions 55 comprising semiconductor $Si_xGe_{(1-x)}$-comprising material. $Si_xGe_{(1-x)}$-comprising material 54 might be the same or different in composition from that of $Si_xGe_{(1-x)}$-comprising layer 16 described above. In one embodiment, Ge quantity in elevated source/drain portions 55 is greater than any quantity of Ge within non-elevated source/drain portions 28. In one embodiment, non-elevated source/drain portions 28 are void of Ge. Regardless in one embodiment, non-elevated source/drain portions 28 comprise silicon.

Without being limited by any theory of invention or operation, elevated source/drain portions comprising the stated $Si_xGe_{(1-x)}$-comprising material as part of the source/drain regions may help increase probability of programming by impact ionization in excessive hole accumulation in a $Si_xGe_{(1-x)}$-comprising region of a floating body channel region. Band bending can increase in the overlap region as to increase tunneling from the valence band via gate induced drain leakage, and also possibly help excessive hole generation during programming.

Figure 18:
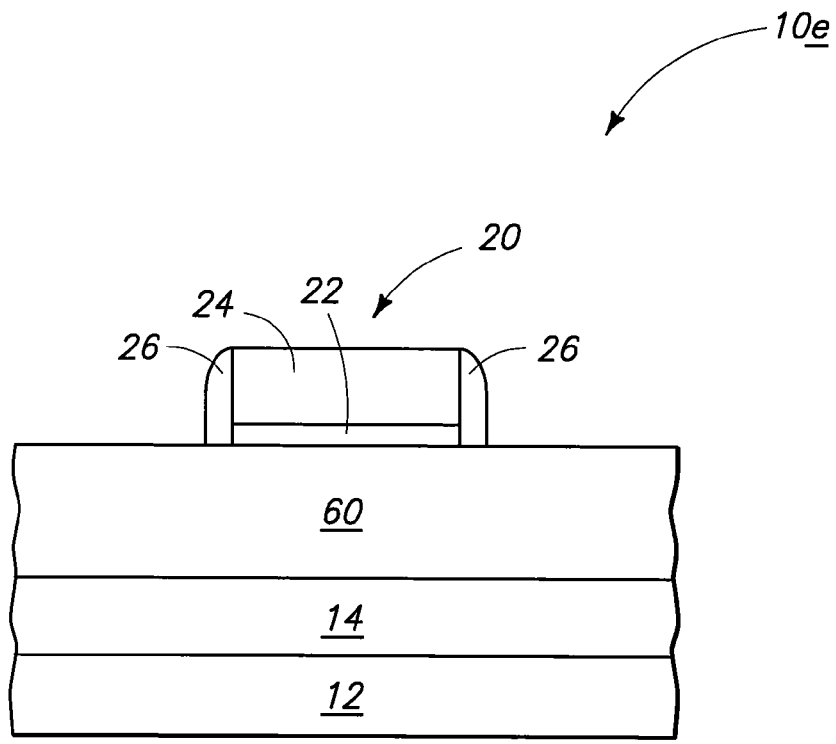
FIG. 18 is a diagrammatic sectional view of another semiconductor substrate in process in accordance with an embodiment of the invention.

Further embodiments of the invention are next described in connection with FIGS. 18-20. Like numerals from the above-described embodiments have been utilized where appropriate, with differences being indicated with the suffix "e" or with different numerals. FIG. 18 depicts a semiconductor substrate 10e largely in accordance with the example FIG. 17 processing. However as with FIG. 17, processing in connection with source/drain fabrication in production of the embodiments of FIGS. 7, 10 and/or 16, or otherwise, is also contemplated in the context of FIG. 18.

In FIG. 18, a semiconductor silicon-comprising layer 60 has been formed over insulator 14. Composition of layer 60 in certain embodiments is in accordance with composition of layer 18 as described above. Accordingly, such may comprise Ge, or may be void of Ge. Regardless, example gate construction 20 is depicted as being formed thereover.

Figure 19:
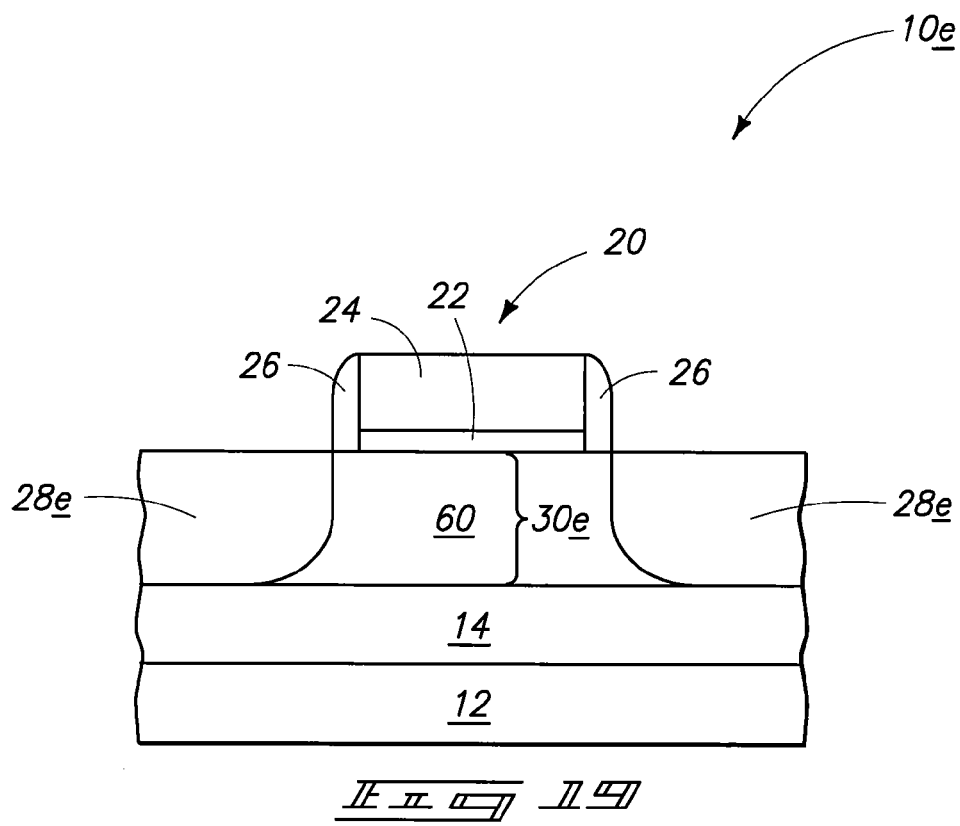
FIG. 19 is a view of the FIG. 18 substrate at a processing step subsequent to that shown in FIG. 18.

Referring to FIG. 19, n-type conductivity enhancing impurity has been ion implanted into unmasked portions of semiconductor silicon-comprising layer 60 to form a pair of highest dopant concentration n-type source/drain regions 28e comprising semiconductor silicon-comprising layer 60 using gate dielectric 22 and gate electrode 24 at least in part as a mask during such ion implanting. A floating body channel region 30e is formed between pair of source/drain regions 28e, and comprises semiconductor silicon-comprising layer 60.

Figure 20:
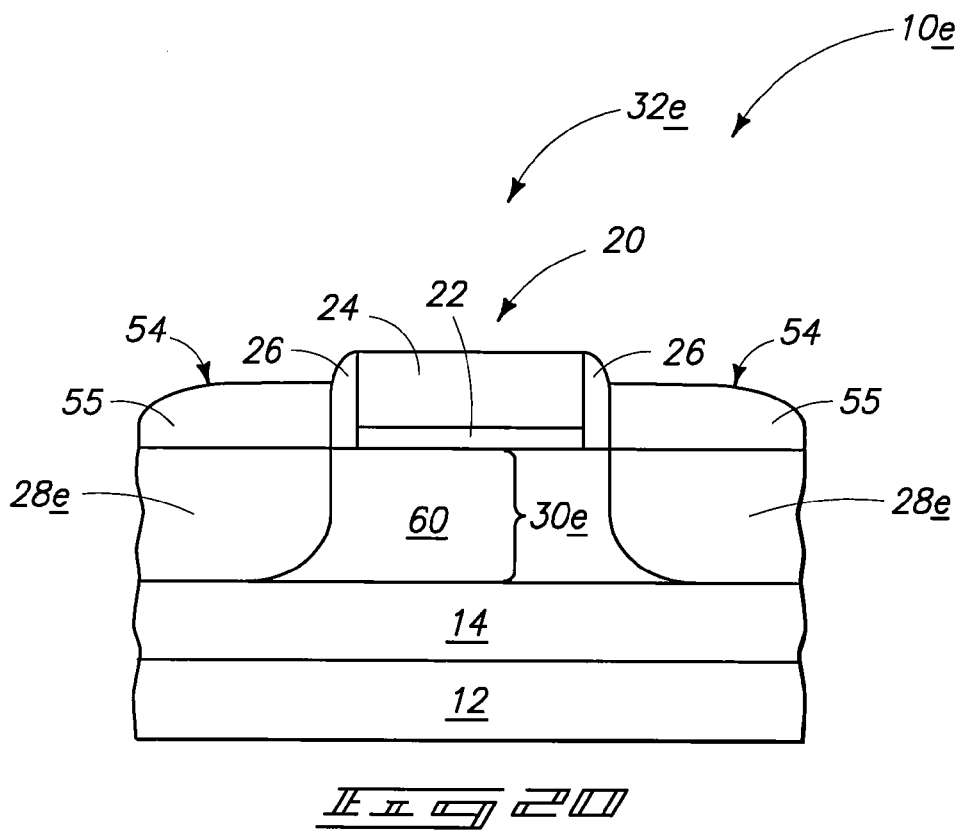
FIG. 20 is a view of the FIG. 19 substrate at a processing step subsequent to that shown in FIG. 19.

Referring to FIG. 20, semiconductor $Si_xGe_{(1-x)}$-comprising material 54 has been epitaxially grown outwardly from pair of highest dopant concentration n-type silicon-comprising source/drain regions 28e to form elevated source/drain portions 55 which comprise semiconductor $Si_xGe_{(1-x)}$-comprising material. Accordingly by way of example only, and further independent of method, FIG. 20 depicts an example floating body field-effect transistor 32e comprising a pair of source/drain regions 28e/55 having a floating body channel region 30e received therebetween. Source/drain regions 28e/55 and floating body channel region 30e are received over an insulator 14. A gate electrode 24 is received proximate floating body channel region 30e, with a gate dielectric 22 being received between gate electrode 24 and floating body channel region 30e. Each of the pair of source/drain regions 28e/55 comprises an elevated source/drain portion 55 and a non-elevated source/drain portion 28e. The elevated source/drain portions comprise $Si_xGe_{(1-x)}$. Non-elevated source/drain portions 28e comprise highest dopant concentration portions comprising silicon. Ge quantity in elevated source/drain portions 55 is greater than any quantity of Ge within the highest dopant concentration portions of non-elevated silicon-comprising source/drain portion 28e.

Further example embodiments are next described in connection with FIGS. 21-24 in connection with a semiconductor substrate 10f. Like numerals from the above-described embodiments are utilized where appropriate, with differences being indicated with the suffix "f" or with different numerals. FIG. 21 is similar to the in-process embodiment of FIG. 3, however with a $Si_xGe_{(1-x)}$-comprising layer 16f not being homogenous at least regarding Ge concentration. For example, FIG. 21 depicts one portion 62 intended to designate a different Ge concentration from that of another portion 64 of $Si_xGe_{(1-x)}$-comprising layer 16f. For example, portion 62 might have higher Ge concentration than portion 64, or portion 64 might have higher concentration Ge than portion 62. Further, a gradual or other different gradient in Ge concentration across the thickness of $Si_xGe_{(1-x)}$-comprising layer 16f may be used.

FIGS. 22 and 23 illustrate subsequent processing occurring which corresponds to that of FIGS. 4 and 5, respectively. Alternately by way of example only, processing in accordance with any of the other above-described embodiments might also be conducted. FIG. 24 depicts processing subsequent to that of FIG. 23 corresponding in accordance with processing depicted by FIG. 17. Alternately by way of example only, processing in accordance with any of the other above-described embodiments might also be conducted.

Without being limited by any theory of invention or operation, in one example embodiment, germanium concentration in portion 64 is provided to be higher than germanium concentration in portion 62. Such might facilitate displacing hole quantity slightly away from insulator 14 to separate such holes from defects inherently occurring at an interface of a semiconductive material such as silicon with insulator 14. Further, a germanium concentration gradient may help control carrier lifetime within the floating body channel for retention improvement.

Figure 25:
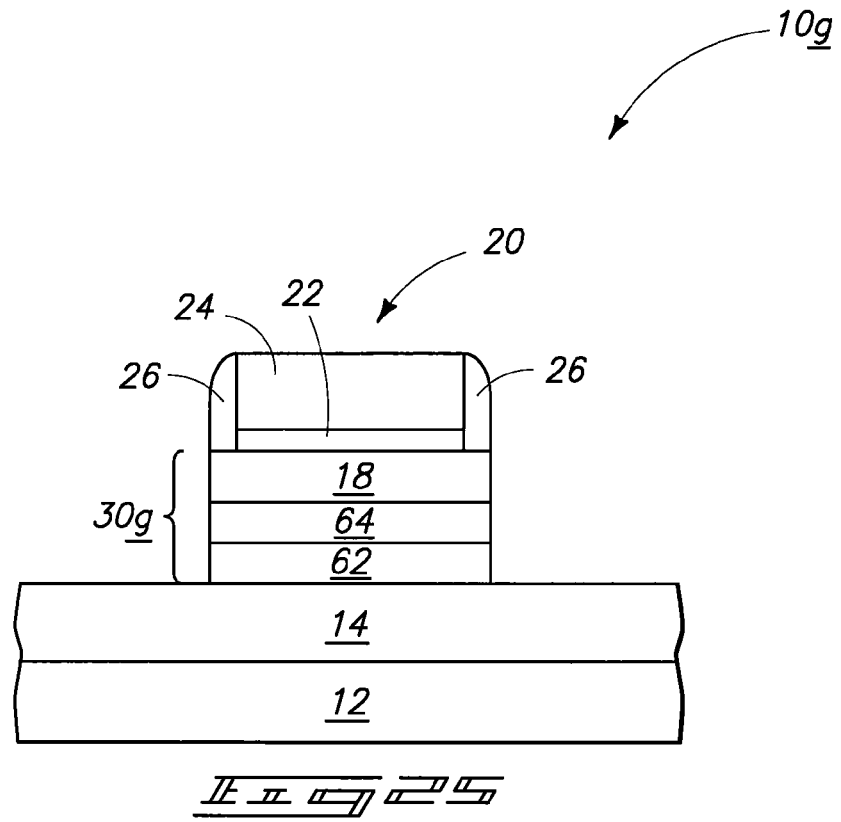
FIG. 25 is a diagrammatic sectional view of another semiconductor substrate in process in accordance with an embodiment of the invention.

Further example embodiments are next described with reference to FIGS. 25-28 in connection with a semiconductor substrate 10g. Like numerals from the above-described embodiments are utilized where appropriate, with differences being indicated with the suffix "g" or with different numerals. FIG. 25 depicts processing of the FIG. 22 substrate alternate to that depicted by FIG. 23. For example and by way of example only, FIG. 25 depicts previous formation of a semiconductor $Si_xGe_{(1-x)}$-comprising layer 64 over and in direct physical contact with a semiconductor silicon-comprising material 62 that is received over an insulator 14. Semiconductor silicon-comprising material 62 in one embodiment comprises Ge, and might be considered as a first $Si_xGe_{(1-x)}$-comprising layer. In one embodiment, Ge concentration in semiconductor $Si_xGe_{(1-x)}$-comprising layer 64 is of greater concentration than any Ge concentration in silicon-comprising layer 62, and in one embodiment semiconductor $Si_xGe_{(1-x)}$-comprising layer 64 might be considered as a second $Si_xGe_{(1-x)}$-comprising layer 64. A semiconductor silicon-comprising layer 18 has been formed over and in direct physical contact with semiconductor $Si_xGe_{(1-x)}$-comprising layer 64. The semiconductor $Si_xGe_{(1-x)}$-comprising layer 64 has greater quantity of Ge than any quantity of Ge within semiconductor silicon-comprising layer 18. Example gate construction 20 has been formed over semiconductor silicon-comprising layer 18.

FIG. 25 also depicts etching having been conducted into unmasked portions of semiconductor silicon-comprising layer 18, second $Si_xGe_{(1-x)}$-comprising layer 64, and first $Si_xGe_{(1-x)}$-comprising layer 62 to form a floating body channel region 30g comprising at least semiconductor silicon-comprising layer 18 and first $Si_xGe_{(1-x)}$-comprising layer 62.

Figure 26:
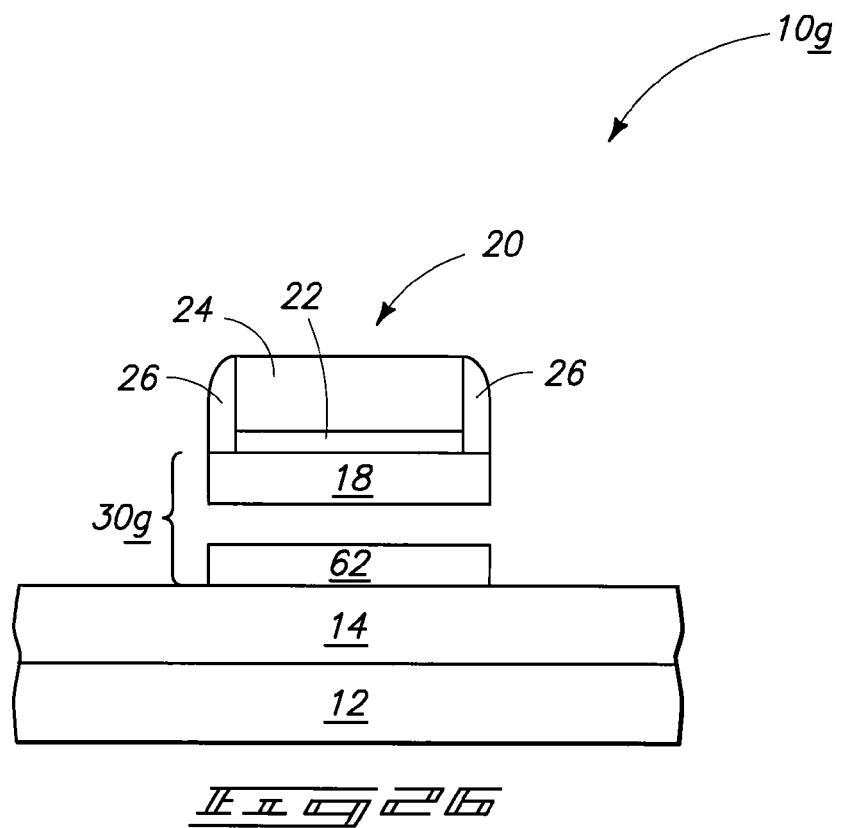
FIG. 26 is a view of the FIG. 25 substrate at a processing step subsequent to that shown in FIG. 25.

Referring to FIG. 26, at least some of second $Si_xGe_{(1-x)}$-comprising layer 64 has been etched selectively relative to first $Si_xGe_{(1-x)}$-comprising layer 62, thereby leaving the depicted gap. The depicted structure would be supported at opposite ends on portions received into and out of the plane of the page upon which FIG. 26 appears. Example etching a higher concentration Ge-comprising silicon-germanium material relative to lower germanium or no germanium concentration silicon-comprising material includes using an HF, $HNO_3$, $H_2O$ solution or a $CH_3COOH$, $H_2O_2$, HF, $H_2O$ solution, or using $CF_4$, $CF_2Cl_2$, and HBr plasmas.

Figure 27:
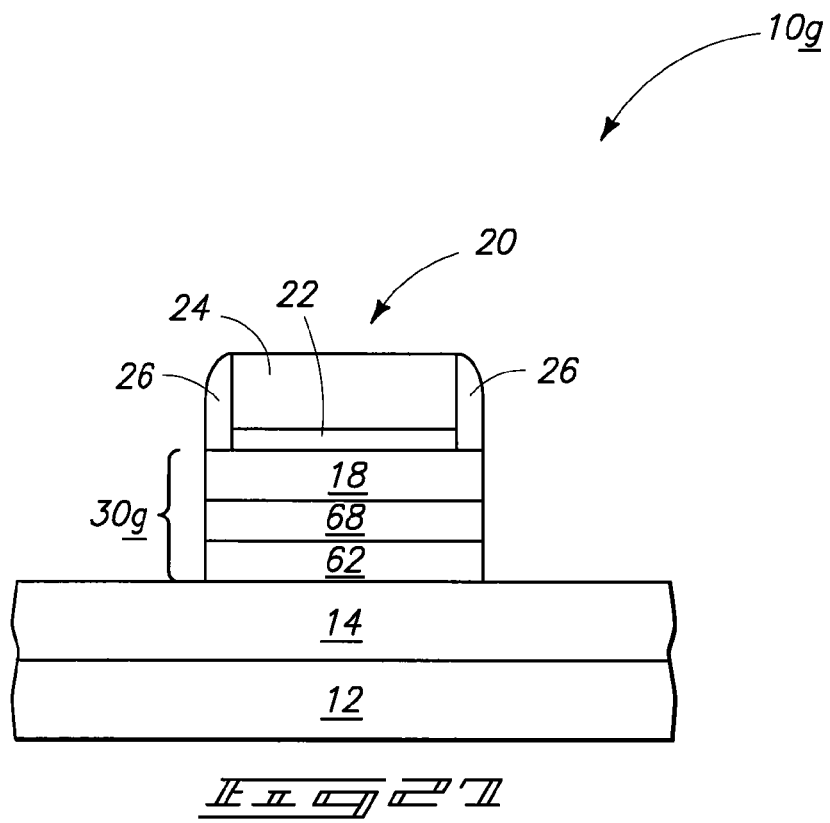
FIG. 27 is a view of the FIG. 26 substrate at a processing step subsequent to that shown in FIG. 26.
Figure 28:
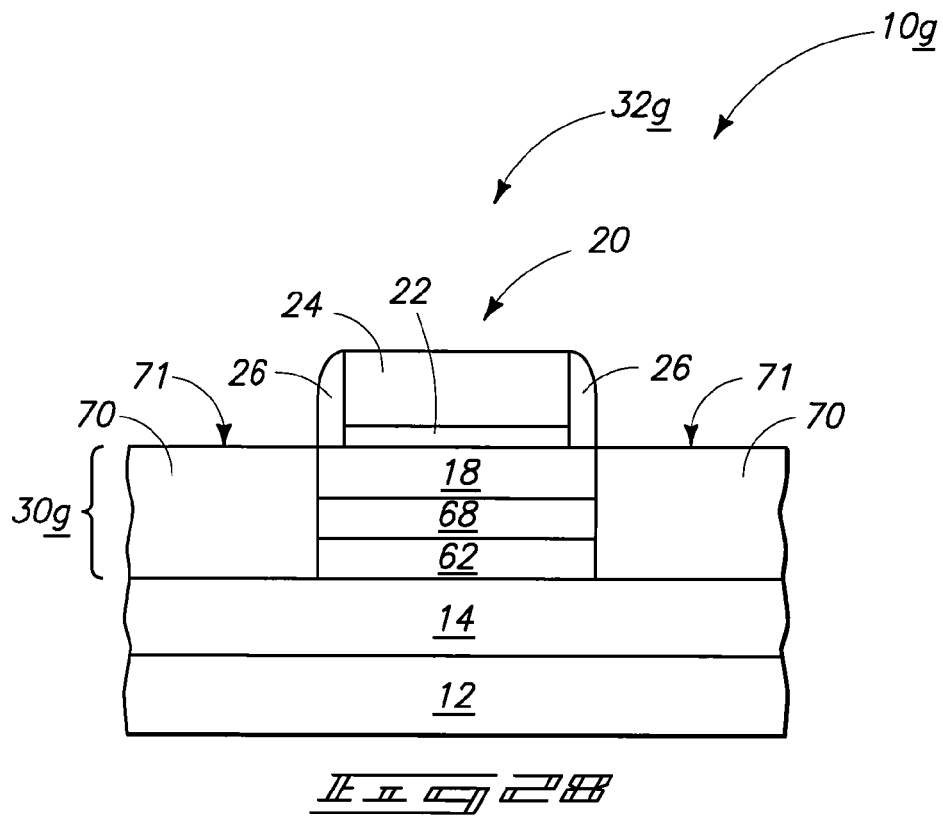
FIG. 28 is a view of the FIG. 27 substrate at a processing step subsequent to that shown in FIG. 27.

Referring to FIG. 27, insulative material 68 has been provided to replace at least some of second $Si_xGe_{(1-x)}$-comprising layer 64 (not shown) which was removed. An example technique for doing so comprises thermal oxidation of one or both of materials 18 and 62. An example thickness range for insulative material 68 is from about 20 Angstroms to about 250 Angstroms. Regardless, outer sidewalls of material 18 and 62 are ultimately outwardly exposed as shown in FIG. 27, with FIG. 28 depicting subsequent epitaxial growth of a semiconductive silicon-comprising material 70 from laterally outermost sidewalls of at least the silicon-comprising layer 18 and first $Si_xGe_{(1-x)}$-comprising layer 62 to form a pair of source/drain regions 71 Not being limited by any theory of invention or operation, a thin insulative layer 68 provided as described in the FIG. 28 embodiment might further isolate excessive holes which are stored in a bottom silicon-germanium-comprising buried channel region and reduce dissipation and thereby perhaps enhance charge retention.

Figure 29:
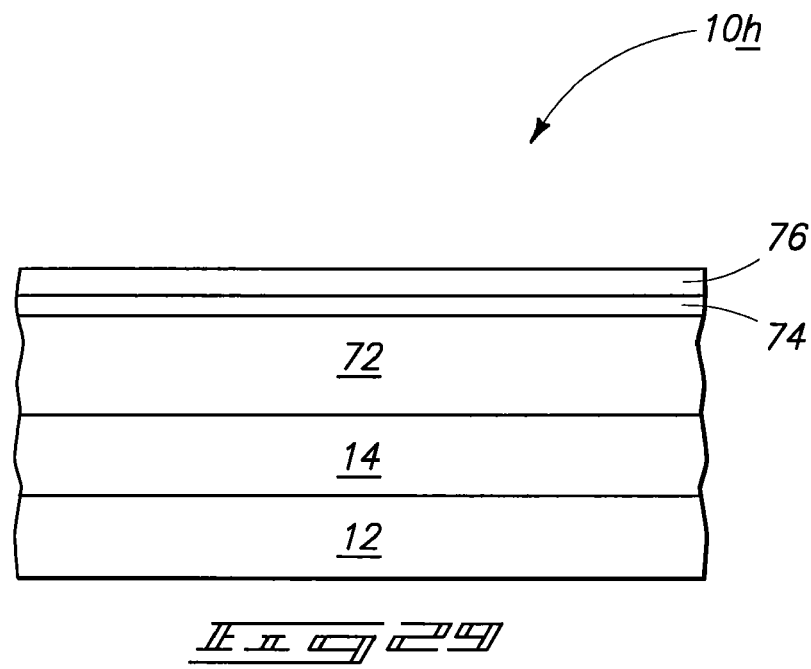
FIG. 29 is a diagrammatic sectional view of another semiconductor substrate in process in accordance with an embodiment of the invention.

Further embodiments are next described in connection with FIGS. 29-36 with respect to a semiconductor substrate 10h. Like numerals from the above-described embodiments are utilized where appropriate, with differences being indicated with a suffix "h" or with different numerals. Referring to FIG. 29, a semiconductor first silicon-comprising layer 72 has been formed over insulator 14. Composition and dimensional parameters of first silicon-comprising layer 72 can, by way of example only, be the same as those described above with respect to layer 18 of the first-described embodiment. A semiconductor $Si_xGe_{(1-x)}$-comprising layer 74 has been formed over first silicon-comprising layer 72. Composition can, by way of example only, be the same as that described above in connection with $Si_xGe_{(1-x)}$-comprising layer 16. An example thickness range for semiconductor $Si_xGe_{(1-x)}$-comprising layer 74 is from about 20 Angstroms to about 250 Angstroms. A semiconductor second silicon-comprising layer 76 is formed over semiconductor $Si_xGe_{(1-x)}$-comprising layer 74. By way of example only, composition for second silicon-comprising layer 76 may be the same as that described above with respect to layer 18, although layers 72 and 76 of course need not be, but may be, of the same composition. An example thickness range for layer 76 is from 20 Angstroms to 250 Angstroms.

Figure 30:
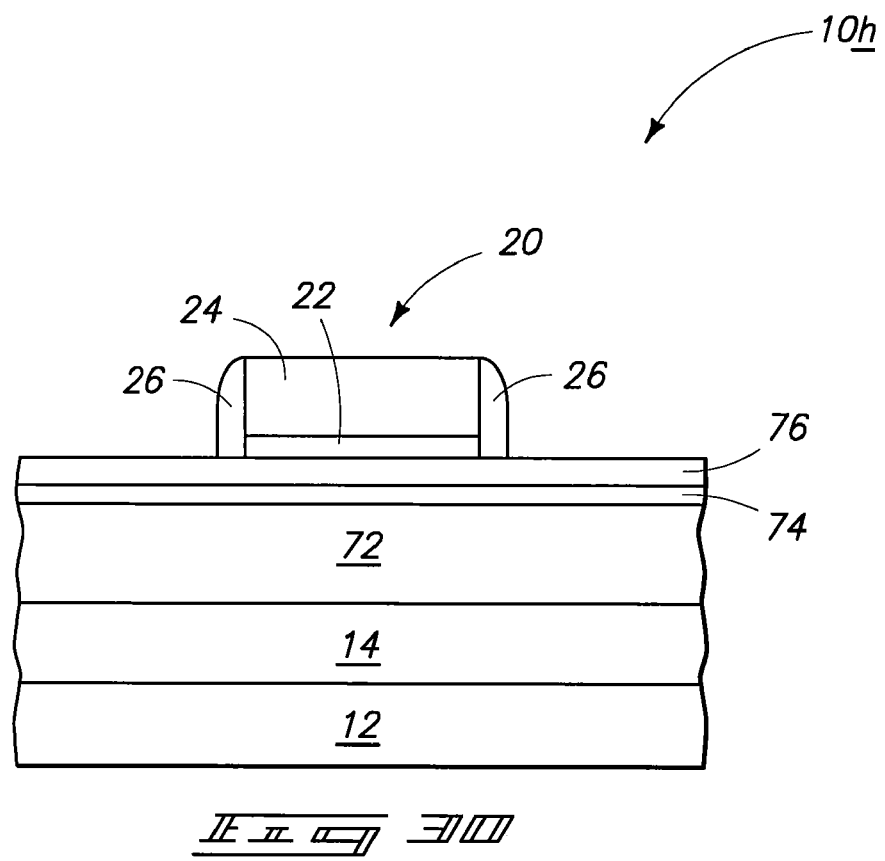
FIG. 30 is a view of the FIG. 29 substrate at a processing step subsequent to that shown in FIG. 29.

Referring to FIG. 30, an example gate construction 20 has been formed over second silicon-comprising layer 76.

Figure 31:
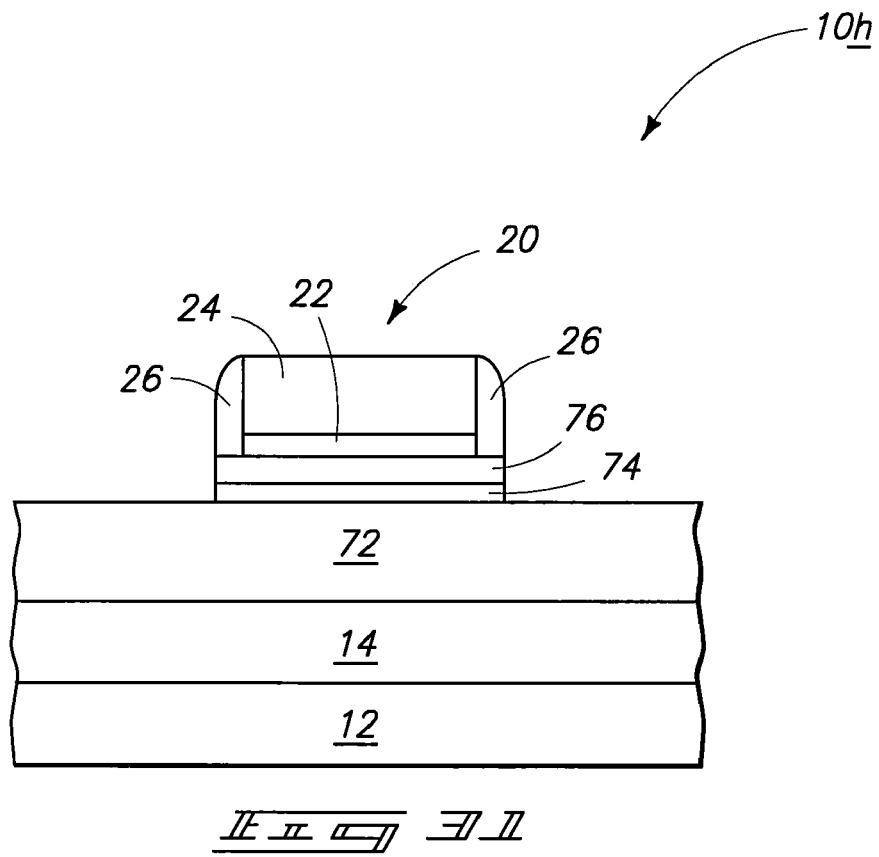
FIG. 31 is a view of the FIG. 30 substrate at a processing step subsequent to that shown in FIG. 30.

Referring to FIG. 31, etching has been conducted into unmasked portions of second silicon-comprising layer 76 and semiconductor $Si_xGe_{(1-x)}$-comprising layer 74 at least to an outer surface of first silicon-comprising layer 72. Such might be conducted by a timed etch, or an etch at least through semiconductor $Si_xGe_{(1-x)}$-comprising layer 74 which is substantially selective to semiconductor first silicon-comprising layer 72.

Figure 32:
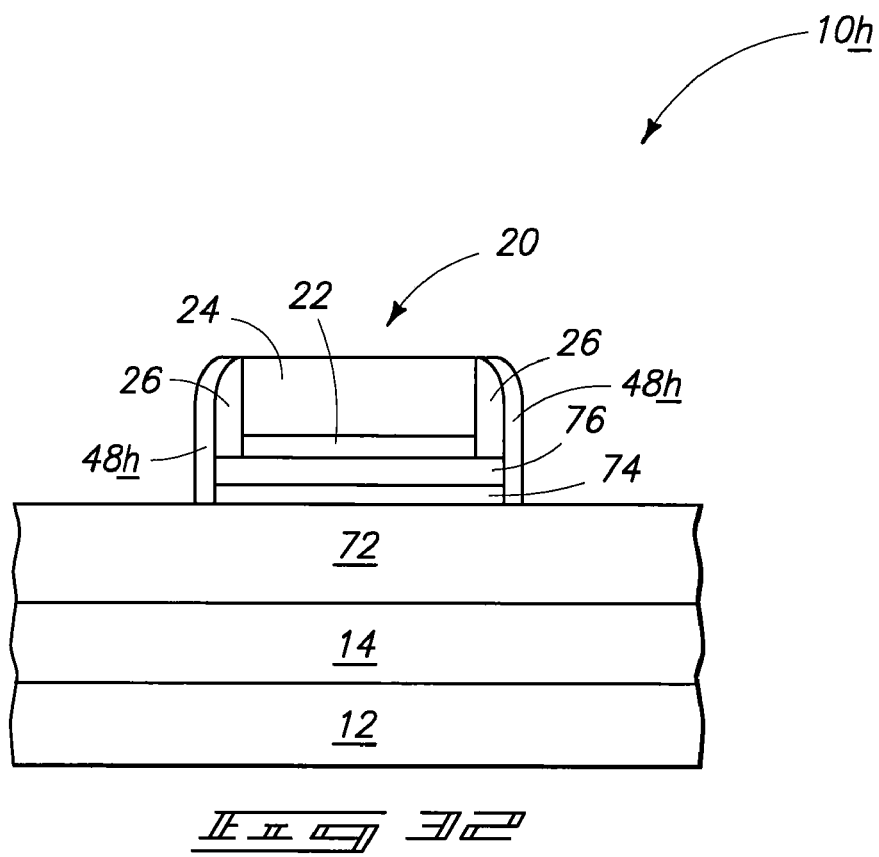
FIG. 32 is a view of the FIG. 31 substrate at a processing step subsequent to that shown in FIG. 31.

Referring to FIG. 32, second spacers 48h have been formed over first spacers 26 and laterally outermost sidewalls of first silicon-comprising layer 76 and $Si_xGe_{(1-x)}$-comprising layer 74.

Figure 33:
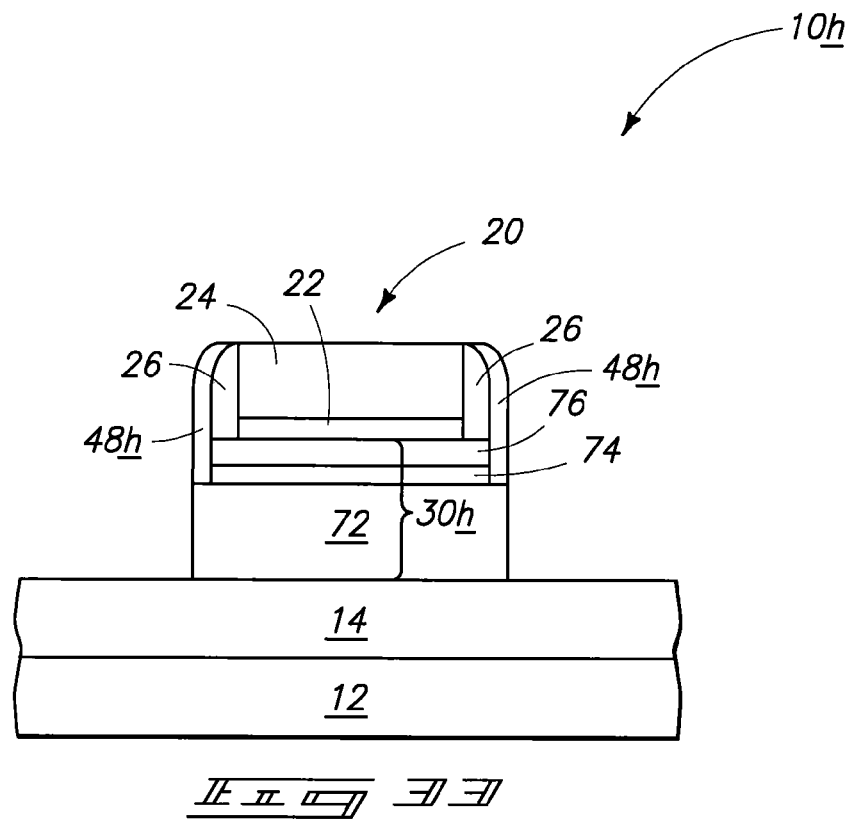
FIG. 33 is a view of the FIG. 32 substrate at a processing step subsequent to that shown in FIG. 32.

Referring to FIG. 33, etching is continued this time into first silicon-comprising layer 72 at least using semiconductor $Si_xGe_{(1-x)}$-comprising layer 74, second silicon-comprising layer 76, second sidewall spacers 48h, first sidewall spacers 26, gate dielectric 22, and gate electrode 24 as a mask during such etching. As depicted, such etching is in one embodiment completely through first silicon-comprising layer 72 to insulator 14. In one embodiment, such thereby forms a floating body channel region 30h.

Figure 34:
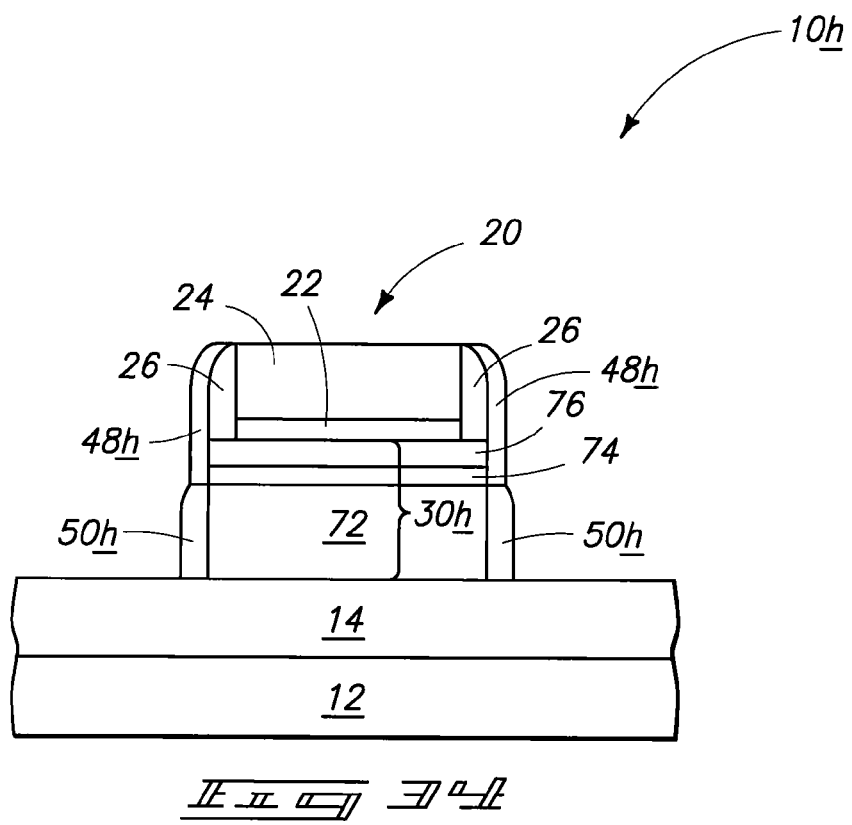
FIG. 34 is a view of the FIG. 33 substrate at a processing step subsequent to that shown in FIG. 33.

Referring to FIG. 34, insulative material 50h has been formed over outermost lateral sidewalls of first silicon-comprising layer 72.

Figure 35:
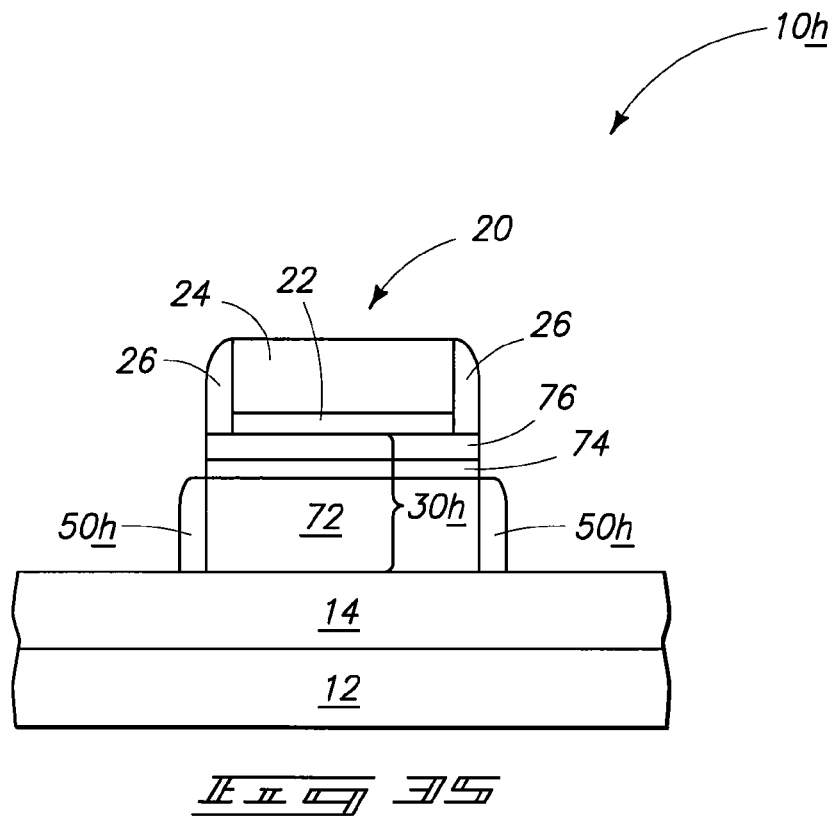
FIG. 35 is a view of the FIG. 34 substrate at a processing step subsequent to that shown in FIG. 34.

Referring to FIG. 35, second sidewall spacers 48h (not shown) have been removed to expose outer lateral sidewalls of second silicon-comprising layer 76 and semiconductor $Si_xGe_{(1-x)}$-comprising layer 74 of floating body channel region 30h.

Figure 36:
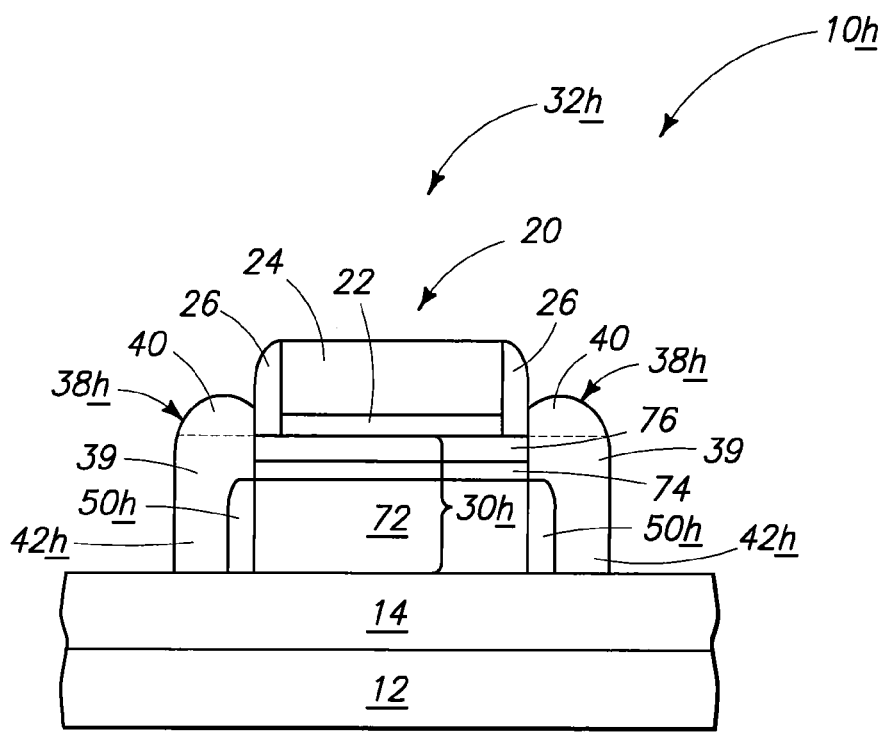
FIG. 36 is a view of the FIG. 35 substrate at a processing step subsequent to that shown in FIG. 35.

Referring to FIG. 36, semiconductive silicon-comprising material 39 has been epitaxially grown from outermost lateral sidewalls of second silicon-comprising layer 76 and semiconductor $Si_xGe_{(1-x)}$-comprising layer 74 of floating body channel region 30h to form a pair of source/drain regions 38h.

Without being limited by any theory of invention or operation, such might facilitate excess hole storage within the floating body channel region, and reduce excessive hole dissipation to the source/drains, thereby lengthening required refresh time.

Regardless, and by way of example only, FIG. 36 depicts an example embodiment floating body field-effect transistor 32h comprising a pair of source/drain regions 38h having a floating body channel region 30h received therebetween. The source/drain regions 38h and floating body channel region 30h are received over an insulator 14. A gate electrode 24 is provided proximate floating body channel region 30h, with a gate dielectric 22 being received between gate electrode 24 and floating body channel region 30h. Floating body channel region 30h comprises a semiconductor first silicon-comprising region 72, a semiconductor second silicon-comprising region 76, and a semiconductor $Si_xGe_{(1-x)}$-comprising region 74 received between region 76 and 72. Semiconductor $Si_xGe_{(1-x)}$-comprising region 74 has greater quantity of Ge than any quantity of Ge within each of semiconductor first and second silicon-comprising regions 72, 76, respectively.

Semiconductor first silicon-comprising region 72 is received directly physically contacting against insulator 14, and comprises laterally outermost sidewalls. An insulative material 50h is received between at least some of such laterally outermost sidewalls and source/drain regions 38h. In one embodiment, first and second silicon-comprising regions 72, 76, respectively, are void of Ge. In one embodiment, semiconductor first and second silicon-comprising region 72, 76, respectively, consists essentially of p-doped silicon. In one embodiment, second silicon-comprising region 76 and semiconductor $Si_xGe_{(1-x)}$-comprising region 74 comprise laterally outermost sidewalls which directly physically contact against source/drain regions 38h.

In one embodiment, a method of forming a floating body field-effect transistor includes forming a semiconductor $Si_xGe_{(1-x)}$-comprising layer and a semiconductor silicon-comprising layer over an insulator. Either might be formed before the other. Regardless, a gate dielectric and a gate electrode are formed over the semiconductor silicon-comprising layer. Using the gate dielectric and the gate electrode at least in part as a mask, etching is conducted into unmasked portions of the semiconductor $Si_xGe_{(1-x)}$-comprising layer and the semiconductor silicon-comprising layer to form a floating body channel region comprising the semiconductor $Si_xGe_{(1-x)}$-comprising layer and the semiconductor silicon-comprising layer. By way of example only, FIGS. 13 and 32/33 depict exemplary such processings.

Insulative material is formed over outermost lateral sidewalls of only one of the semiconductor $Si_xGe_{(1-x)}$-comprising layer and the semiconductor silicon-comprising layer of the floating body channel region and not over the other of the semiconductor $Si_xGe_{(1-x)}$-comprising layer and the semiconductor silicon-comprising layer of the floating body channel region. By way of example only, FIGS. 14 and 34 depict such processing. After such formation of insulative material, semiconductive silicon-comprising material is epitaxially grown from outermost lateral sidewalls of the other of the semiconductor $Si_xGe_{(1-x)}$-comprising layer and the semiconductor silicon-comprising layer of the floating body channel region to form a pair of source/drain regions. Again by way of example only, FIGS. 16 and 36 depict exemplary such processing.

Figure 37:
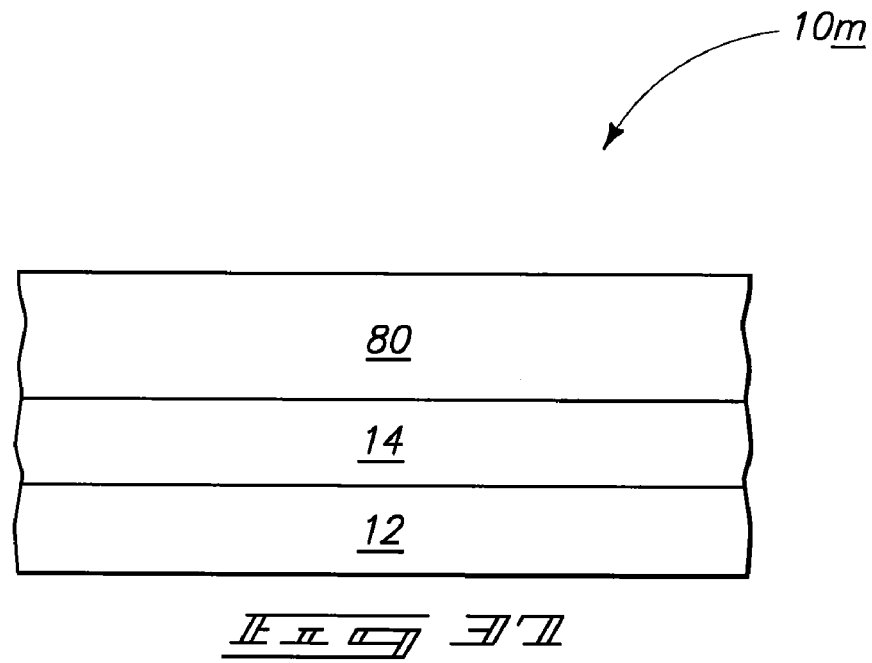
FIG. 37 is a diagrammatic sectional view of another semiconductor substrate in process in accordance with an embodiment of the invention.

Further embodiments are next described in conjunction with FIGS. 37-43 with respect to a semiconductor substrate 10m. Like numerals from the above-described embodiments are utilized where appropriate, with differences being indicated with the suffix "m" or with different numerals. Referring to FIG. 37, a semiconductive material first region 80 has been formed over insulator 14. By way of examples only, composition for the same might be either of that described above in connection with layers 16 and 18 in the first-described embodiments. Accordingly and in but one embodiment, first region 80 comprises a silicon-comprising material which has been deposited over insulator 14, and in one embodiment in direct physical contact therewith.

Figure 38:
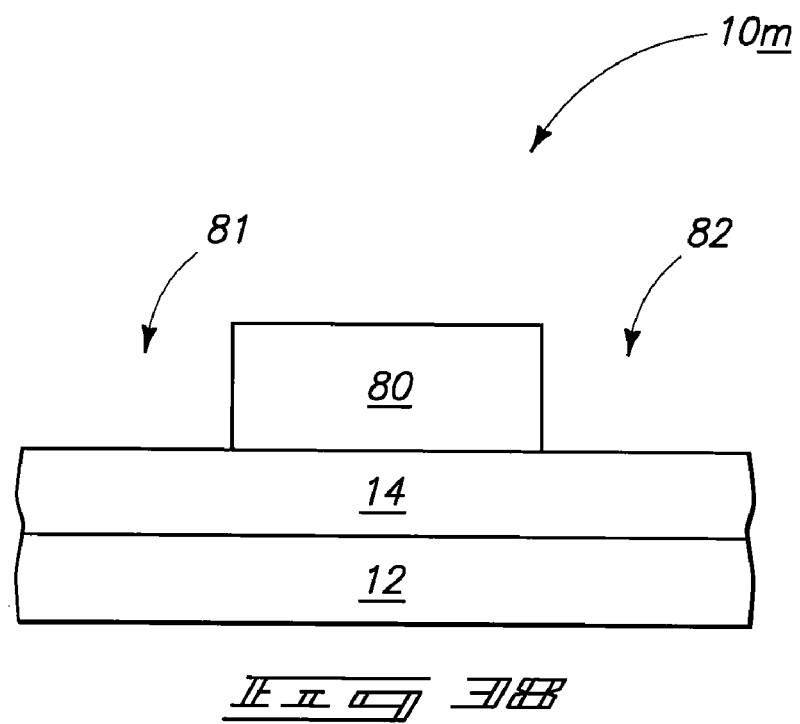
FIG. 38 is a view of the FIG. 37 substrate at a processing step subsequent to that shown in FIG. 37.

Referring to FIG. 38, trenches 81 and 82 have been etched into silicon-comprising material 80 to insulator 14.

Figure 39:
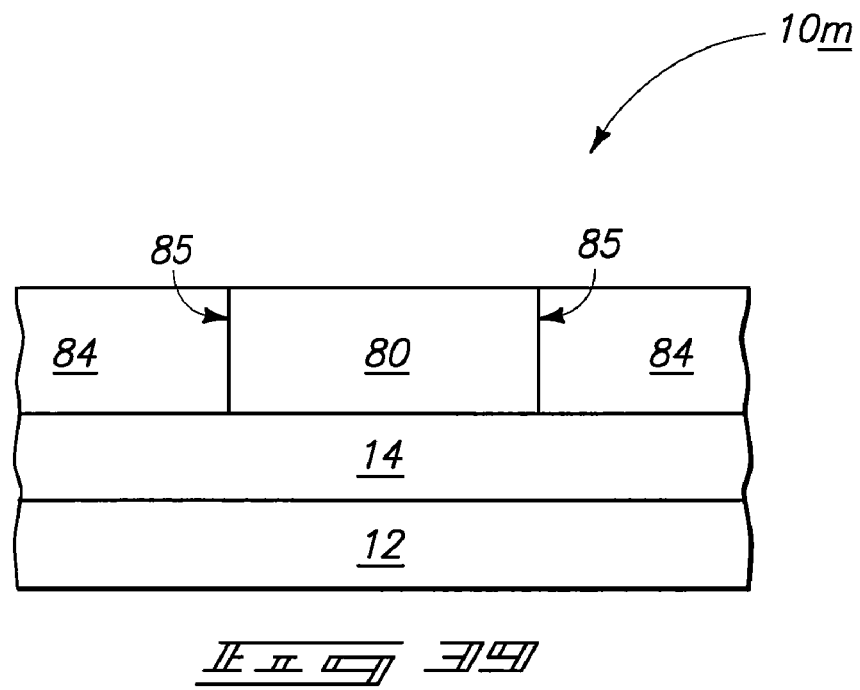
FIG. 39 is a view of the FIG. 38 substrate at a processing step subsequent to that shown in FIG. 38.

Referring to FIG. 39, trenches 81 and 82 have been filled with insulative material 84. Example materials 84 include doped or undoped silicon dioxide, and/or silicon nitride. An example manner of forming the construction of FIG. 39 is by deposition of material 84 effective to overfill trenches 81 and 82, followed by chemical mechanical polishing thereof at least to an outer surface of semiconductive material first region 80. For purposes of the continuing discussion, first region 80 can be considered as comprising laterally outermost sidewalls 85 having insulative material 84 received contacting directly physically there-against. Such provides but one example method of forming a semiconductive material first region 80 over an insulator 14, where insulative material 84 is received contacting directly physically against laterally outermost sidewalls 85 of first region 80. Any alternate example manner of forming the same might also be utilized, and whether existing or yet-to-be developed.

Figure 40:
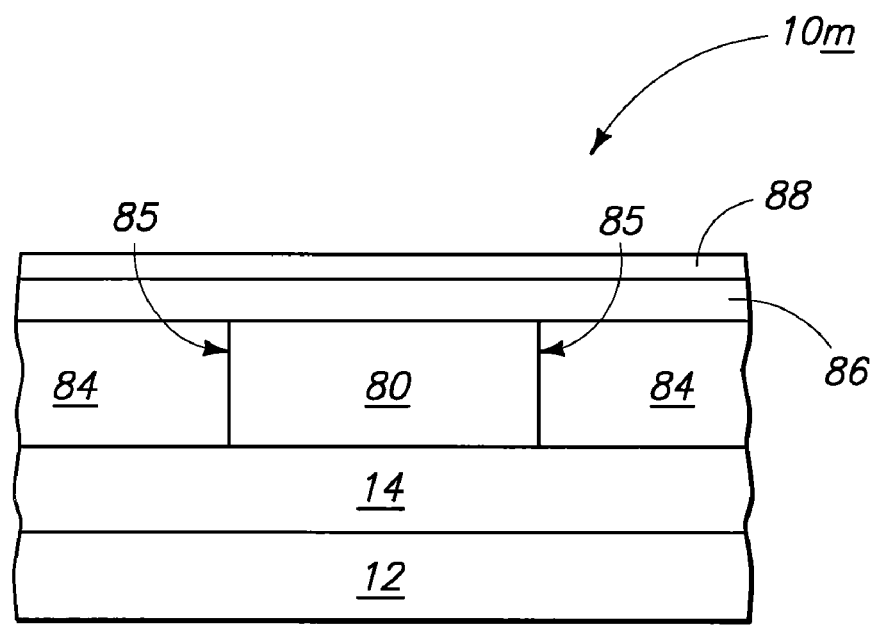
FIG. 40 is a view of the FIG. 39 substrate at a processing step subsequent to that shown in FIG. 39.

Referring to FIG. 40, a semiconductive material second region 86 has been formed over and in direct physical contact with semiconductive material first region 80 and over insulative material 84. Again, example materials for semiconductive second material second region 86 are either of those as described above in connections with layers 16 and 18 of the first-described embodiment. Alternate materials are, of course, contemplated. Regardless, materials 80 and 86 might be of the same composition, or of different composition. Further, respective materials 80 and 86 might be homogenous or non-homogenous. One manner of forming semiconductive material second region 86 is by epitaxial growth. For example, a seed layer can be deposited at least over insulative material 84, with material 86 being epitaxially grown therefrom and from semiconductive material first region 80. In one embodiment and after such growth, semiconductive material second region 86 might be polished, for example by chemical mechanical polishing. Regardless, FIG. 40 depicts a gate dielectric 88 as having been formed over semiconductive material second region 86. An example material is thermally grown silicon dioxide.

Figure 41:
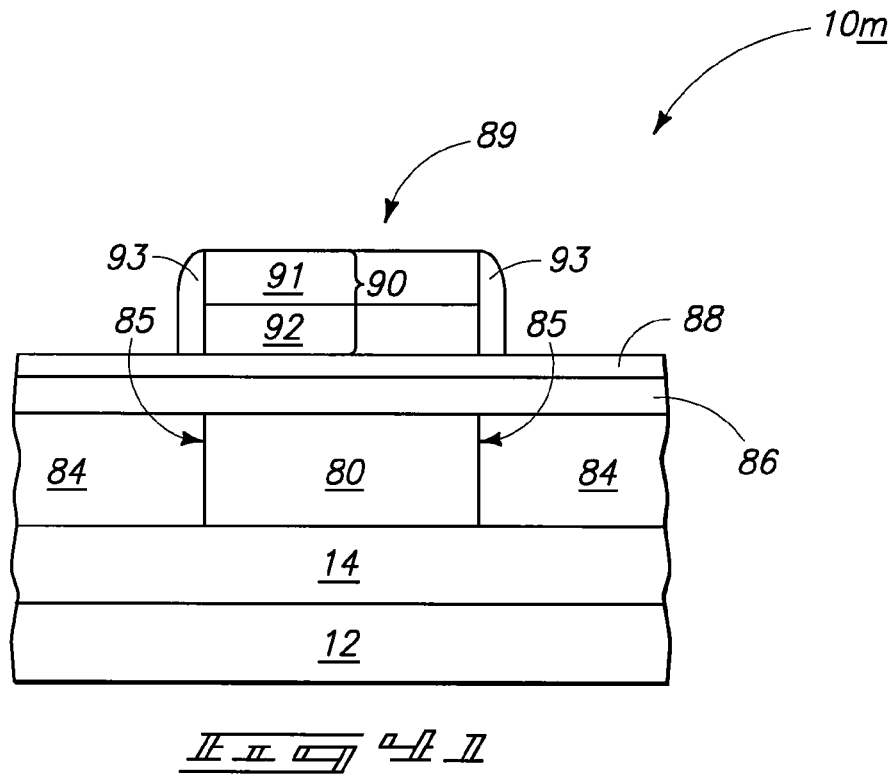
FIG. 41 is a view of the FIG. 40 substrate at a processing step subsequent to that shown in FIG. 40.

Referring to FIG. 41, a gate construction 89 has been formed. Such is depicted as comprising a gate electrode 90 comprised of conductive layers 91 and 92. By way of example only, conductive layer 92 might comprise conductively doped polysilicon, while conductive layer 91 might comprise one or a combination of a refractory metal and/or a refractory metal silicide. Gate construction 89 is also depicted as comprising anisotropically etched insulative sidewall spacers 93 which have been formed over laterally outermost sidewalls of gate electrode 90. An insulative cap (not shown) might also of course be formed.

Figure 42:
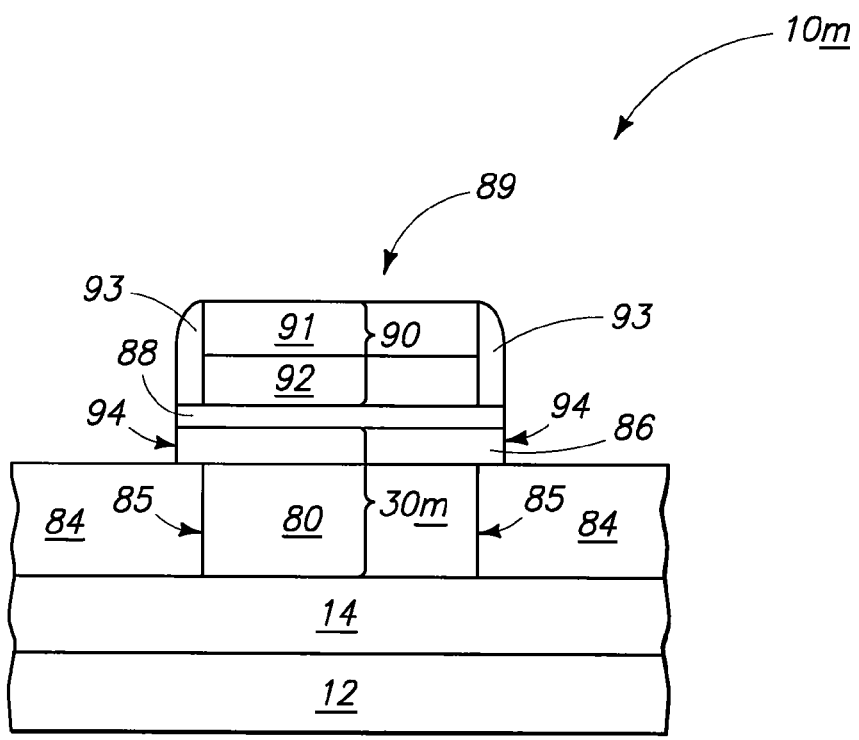
FIG. 42 is a view of the FIG. 41 substrate at a processing step subsequent to that shown in FIG. 41.

Referring to FIG. 42, etching has been conducted into unmasked portions of semiconductive material second region 86 to insulative material 84 to form a floating body channel region 30m comprising semiconductive material first region 80 and semiconductive material second region 86. Such etching has been conducted using gate dielectric 88 and gate electrode 90 at least in part as a mask for such etching. In the depicted embodiment, anisotropically etched sidewall spacers 93 have also been used as a mask during such etching, with semiconductive material second region 86 being unmasked first by the etching of gate dielectric 88. For purposes of the continuing discussion, semiconductive material second region 86 can be considered as comprising laterally outermost sidewalls 94.

Figure 43:
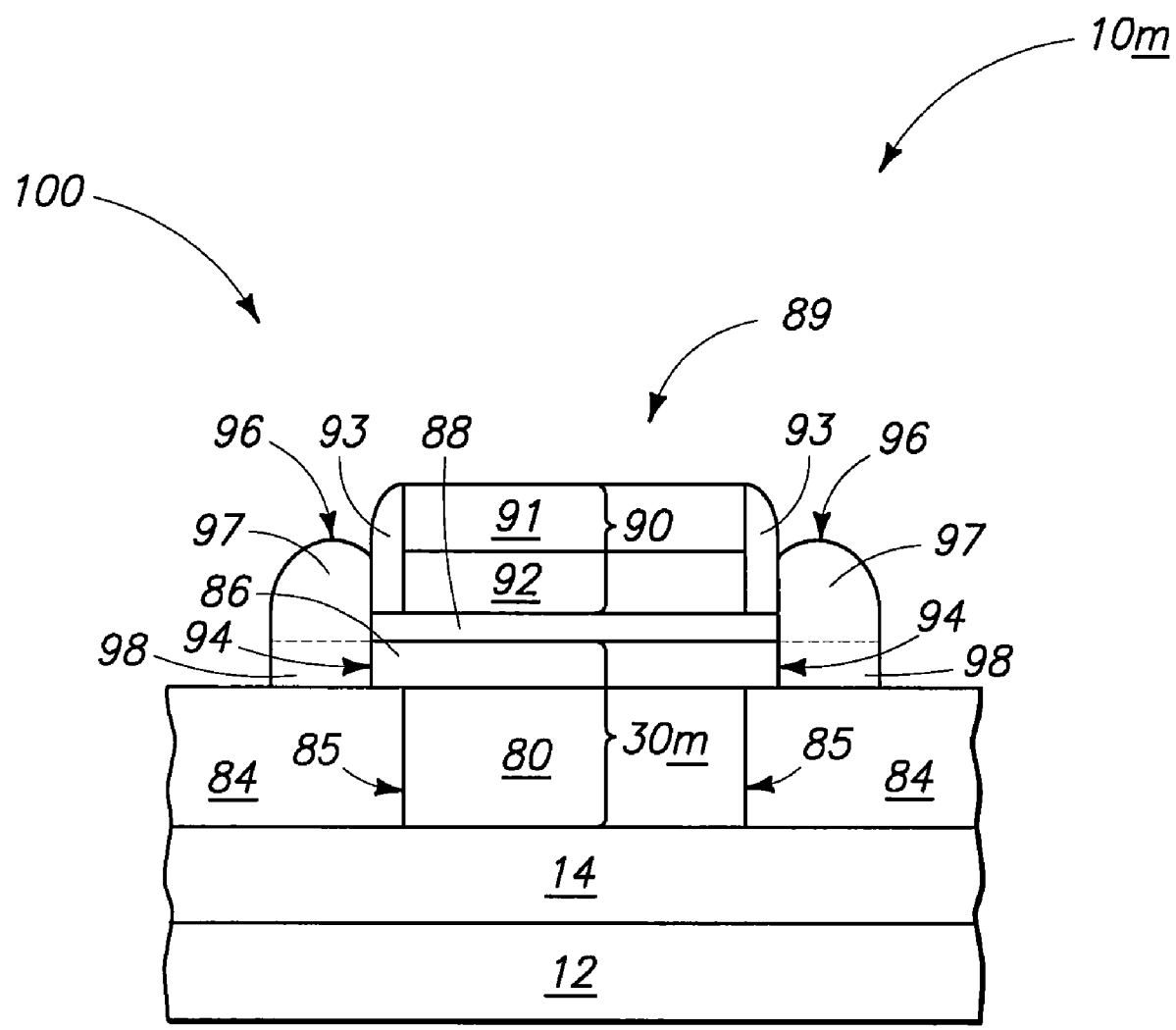
FIG. 43 is a view of the FIG. 42 substrate at a processing step subsequent to that shown in FIG. 42.

Referring to FIG. 43, semiconductive material has been epitaxially grown from laterally outermost sidewalls 94 of at least semiconductive material second region 86 to form a pair of source/drain regions 96. In one embodiment and as shown, pair of source/drain regions 96 are epitaxially grown over insulative material 84 and in one embodiment in direct physical contact therewith. Each source/drain region 96 in one embodiment, and as shown, is formed to comprise an elevated source/drain portion 97 and a non-elevated source/drain portion 98. In one embodiment, source/drain regions comprise silicon, with example materials being as described above in connection with source/drain regions 38 of the example FIG. 7 embodiment.

FIG. 43 also depicts an example floating body field-effect transistor 100 independent of method of fabrication. In one such embodiment, such comprises a pair of source/drain regions 96 having a floating body channel region 30m received therebetween. Source/drain regions 96 and floating body channel region 30m are received over an insulator 14. A gate electrode 90 is received proximate floating body channel region 30m, with a gate dielectric 88 being received between gate electrode 90 and floating body channel region 30m. Such floating body channel region comprises first and second regions 80 and 86, respectively, with second region 86 being received elevationally between gate dielectric 88 and first region 80. First region 80 comprises laterally outermost sidewalls 85, with insulative material 84 being received contacting directly physically against laterally outermost sidewalls 85 of first region 80. In one embodiment, first region 80 has a thickness which is greater than that of second region 86. In one embodiment, each of first and second regions 80 and 86 is void of Ge. Yet in one embodiment, at least one of first and second regions 80 and 86, respectively, comprises Ge. One or both of regions 80 and 86 might form hole storage volume. In one embodiment, region 80 comprises hole storage volume and in one embodiment an elevationally inward portion thereof. Region 80 may comprise $Si_xGe_{(1-x)}$ for example in any of the orientations, positions, and/or concentrations as described above and with or without other silicon-comprising material as also described above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A floating body field-effect transistor comprising:
   a pair of source/drain regions having a floating body channel region received therebetween, the source/drain regions and the floating body channel region being received over an insulator;
   a gate electrode proximate the floating body channel region;
   a gate dielectric received between the gate electrode and the floating body channel region;
   the floating body channel region comprising a semiconductor $Si_xGe_{(1-x)}$-comprising region; and
   the floating body channel region comprising a semiconductor silicon-comprising region received between the semiconductor $Si_xGe_{(1-x)}$-comprising region and the gate dielectric, the semiconductor $Si_xGe_{(1-x)}$-comprising region having greater quantity of Ge than any quantity of Ge within the semiconductor silicon-comprising region, the semiconductor $Si_xGe_{(1-x)}$-comprising region comprising laterally outermost sidewalls, the source/drain regions individually elevationally overlapping with and being laterally outward of said laterally outermost sidewalls of the semiconductor $Si_xGe_{(1-x)}$-comprising region, insulative material received laterally between at least some of said laterally outermost sidewalls of the semiconductor $Si_xGe_{(1-x)}$-comprising region and the individual source/drain regions.

2. The floating body field-effect transistor of claim 1 wherein the semiconductor silicon-comprising region is void of Ge.

3. The floating body field-effect transistor of claim 1 wherein the semiconductor silicon-comprising region comprises Ge.

4. The floating body field-effect transistor of claim 3 wherein Ge quantity in the semiconductor silicon-comprising region is less than about 10 atomic percent.

5. The floating body field-effect transistor of claim 1 wherein the semiconductor $Si_xGe_{(1-x)}$-comprising region has a thickness of at least 20 Angstroms.

6. The floating body field-effect transistor of claim 1 wherein the semiconductor $Si_xGe_{(1-x)}$-comprising region has a thickness which is from about 25% to about 75% of total thickness of the floating body channel region.

7. The floating body field-effect transistor of claim 1 wherein the semiconductor $Si_xGe_{(1-x)}$-comprising region has a thickness which is less than that of the semiconductor silicon-comprising region.

8. The floating body field-effect transistor of claim 1 wherein the semiconductor $Si_xGe_{(1-x)}$-comprising region has a thickness which is greater than that of the semiconductor silicon-comprising region.

9. The floating body field-effect transistor of claim 1 wherein the semiconductor $Si_xGe_{(1-x)}$-comprising region has a maximum width which is greater than that of the semiconductor silicon-comprising region.

10. The floating body field-effect transistor of claim 1 wherein the semiconductor $Si_xGe_{(1-x)}$-comprising region and the semiconductor silicon-comprising region have the same maximum widths.

11. The floating body field-effect transistor of claim 1 wherein each of the pair of source/drain regions comprises an elevated source/drain portion and a non-elevated source/drain portion.

12. The floating body field-effect transistor of claim 11 wherein the elevated source/drain portion comprises $Si_xGe_{(1-x)}$-comprising material.

13. The floating body field-effect transistor of claim 12 wherein Ge quantity in the elevated source/drain portion is greater than any quantity of Ge within the non-elevated source/drain portion.

14. The floating body field-effect transistor of claim 13 wherein the non-elevated source/drain portion comprises a highest dopant concentration region, at least the highest dopant concentration region of the non-elevated source/drain portion being void of Ge.

15. The floating body field-effect transistor of claim 14 wherein at least the highest dopant concentration region of the non-elevated source/drain portion comprises silicon.

16. The floating body field-effect transistor of claim 1 wherein the semiconductor $Si_xGe_{(1-x)}$-comprising region is received directly physically contacting against the insulator.

17. The floating body field-effect transistor of claim 1 wherein the semiconductor $Si_xGe_{(1-x)}$-comprising region is not received directly physically contacting against the insulator.

18. The floating body field-effect transistor of claim 1 comprising another semiconductor silicon-comprising region received between the semiconductor $Si_xGe_{(1-x)}$-comprising region and the insulator, the semiconductor $Si_xGe_{(1-x)}$-comprising region having greater quantity of Ge than any quantity of Ge within the another semiconductor silicon-comprising region.

19. The floating body field-effect transistor of claim 1 wherein the semiconductor $Si_xGe_{(1-x)}$-comprising region comprises laterally outermost sidewalls which directly physically contact against the source/drain regions.

20. The floating body field-effect transistor of claim 1 wherein the semiconductor $Si_xGe_{(1-x)}$-comprising region is homogenous at least regarding Ge concentration.

21. The floating body field-effect transistor of claim 1 wherein the semiconductor $Si_xGe_{(1-x)}$-comprising region is not homogenous at least regarding Ge concentration.

22. The floating body field-effect transistor of claim 1 wherein the insulative material is received laterally between all of said laterally outermost sidewalls of the semiconductor $Si_xGe_{(1-x)}$-comprising region and the source/drain regions.

23. The floating body field-effect transistor of claim 1 wherein the individual source/drain regions have sidewalls laterally facing the floating body channel region and the semiconductor silicon-comprising region has opposing sidewalls laterally facing said source/drain region sidewalls, said source/drain region sidewalls contacting directly physically against said semiconductor silicon-comprising region sidewalls.

24. The floating body field-effect transistor of claim 1 wherein each of the pair of source/drain regions comprises an elevated source/drain portion and a non-elevated source/drain portion.

25. A floating body field-effect transistor comprising:
a pair of source/drain regions having a floating body channel region received therebetween, the source/drain regions and the floating body channel region being received over an insulator;
a gate electrode proximate the floating body channel region;
a gate dielectric received between the gate electrode and the floating body channel region; and
the floating body channel region comprising first and second regions, the second region being received elevationally between the gate dielectric and the first region, the first region comprising laterally outermost sidewalls, the source/drain regions individually elevationally overlapping with and being laterally outward of said laterally outermost sidewalls of the first region, insulative material received laterally between said laterally outermost sidewalls of the first region and the individual source/drain regions, the insulative material contacting directly physically against the laterally outermost sidewalls of the first region.

26. The floating body field-effect transistor of claim 25 wherein the individual source/drain regions have sidewalls laterally facing the floating body channel region, the insulative material being contacting directly physically against said source/drain region sidewalls.

27. The floating body field-effect transistor of claim 25 wherein each of the pair of source/drain regions comprises an elevated source/drain portion and a non-elevated source/drain portion.

28. The floating body field-effect transistor of claim 25 wherein the first region has a thickness which is greater than that of the second region.

29. The floating body field-effect transistor of claim 25 wherein each of the first and second regions is void of Ge.

30. The floating body field-effect transistor of claim 25 wherein at least one of the first and second regions comprises Ge.

* * * * *